United States Patent
Klootwijk et al.

(10) Patent No.: US 11,061,320 B2
(45) Date of Patent: Jul. 13, 2021

(54) METHOD FOR MANUFACTURING A MEMBRANE ASSEMBLY

(71) Applicant: ASML NETHERLANDS B.V., Veldhoven (NL)

(72) Inventors: Johan Hendrik Klootwijk, Eindhoven (NL); Wilhelmus Theodorus Anthonius Johannes Van Den Einden, Deurne (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/897,535

(22) Filed: Jun. 10, 2020

(65) Prior Publication Data

US 2020/0301269 A1    Sep. 24, 2020

Related U.S. Application Data

(62) Division of application No. 15/743,275, filed as application No. PCT/EP2016/065703 on Jul. 4, 2016, now Pat. No. 10,712,657.

(30) Foreign Application Priority Data

Jul. 17, 2015    (EP) .................................... 15177332

(51) Int. Cl.
  *G03F 1/64* (2012.01)
  *G03F 1/62* (2012.01)
  *G03F 1/66* (2012.01)

(52) U.S. Cl.
  CPC .................. *G03F 1/64* (2013.01); *G03F 1/62* (2013.01); *G03F 1/66* (2013.01)

(58) Field of Classification Search
  CPC ..................................... G03F 1/62; G03F 1/64
  USPC ........................................................... 430/5
  See application file for complete search history.

(56) References Cited

U.S. PATENT DOCUMENTS

| | | | |
|---|---|---|---|
| 6,623,893 B1 | 9/2003 | Levinson et al. | |
| 7,901,846 B2 | 3/2011 | Kubota et al. | |
| 10,712,656 B2* | 7/2020 | Houweling | G03F 7/70983 |
| 10,712,657 B2* | 7/2020 | Klootwijk | G03F 1/62 |
| 2009/0104544 A1 | 4/2009 | Kubota et al. | |
| 2011/0065278 A1 | 3/2011 | Kim | |
| 2012/0308779 A1 | 12/2012 | Klee et al. | |
| 2014/0370423 A1 | 12/2014 | Goldfarb | |

FOREIGN PATENT DOCUMENTS

| | | |
|---|---|---|
| CN | 101056714 | 10/2007 |
| CN | 102740958 | 10/2012 |
| JP | 2002-508583 | 3/2002 |
| JP | 2004-111713 | 4/2004 |
| JP | 2008-518773 | 6/2008 |
| JP | 2010-256434 | 11/2010 |
| JP | 2014-211474 | 11/2014 |
| JP | 5686394 | 1/2015 |
| KR | 2009-0032876 | 4/2009 |
| WO | 99/24141 | 5/1999 |
| WO | 2014/020003 | 2/2014 |

OTHER PUBLICATIONS

International Search Report and Written Opinion dated Oct. 7, 2016 in corresponding International Patent Application No. PCT/EP2016/065703.
Anonymous, "Method for a composite silicon-carbon pellicle for EUV lithography applications", ip.com Journal, XP013020985, 6 pages (2004).
Akiyama, Shoji et al., "Realization of EUV pellicle with single crystal silicon membrane", 2009 International EUVL Symposium, Prague, Czech Republic, Retrieved from the Internet: URL:http://www.sematech.org/meetings/archives/litho/8653/poster/P019_Akiyama_Shin-Etsu.pdf [retrieved on May 12, 2014], 16 pages, XP055117364 (2009).
Lo, Hsi-Wen et al., "Recrystallized parylene as a mask for silicon chemical etching", Proceedings of the 3rd IEEE International Conference on Nano/Micro Engineered and Molecular Systems, Sanya, China, pp. 881-884 (2008).
Disclosed Anonymously, Research Disclosure, Database No. 594072, 4 pages (2013).
Japanese Office Action issued in corresponding Japanese Patent Application No. 2017-565898, dated Apr. 9, 2020.
Chinese Office Action issued in corresponding Chinese Patent Application No. 201660042163.3, dated Aug. 24, 2020.

\* cited by examiner

*Primary Examiner* — Christopher G Young
(74) *Attorney, Agent, or Firm* — Pillsbury Winthrop Shaw Pittman LLP

(57) ABSTRACT

A method for manufacturing a membrane assembly for EUV lithography, the method including: providing a stack having a planar substrate and at least one membrane layer, wherein the planar substrate includes an inner region and a border region around the inner region; and selectively removing the inner region of the planar substrate. The membrane assembly includes: a membrane formed from the at least one membrane layer; and a border holding the membrane, the border formed from the border region of the planar substrate. The stack is provided with a mechanical protection material configured to mechanically protect the border region during the selectively removing the inner region of the planar substrate.

21 Claims, 16 Drawing Sheets

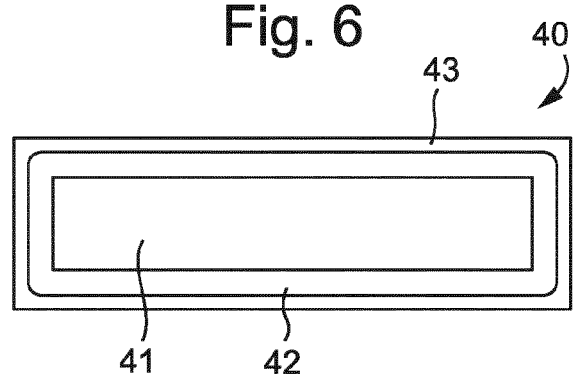
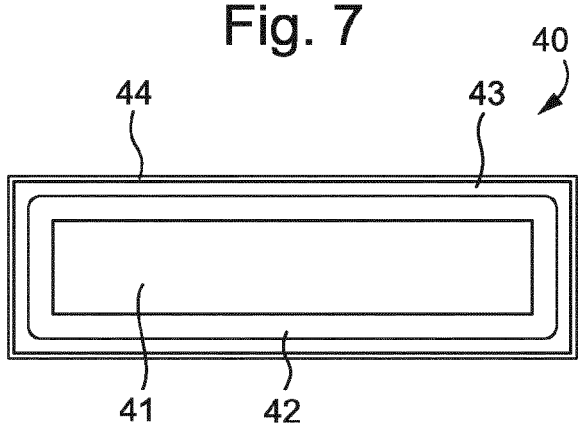
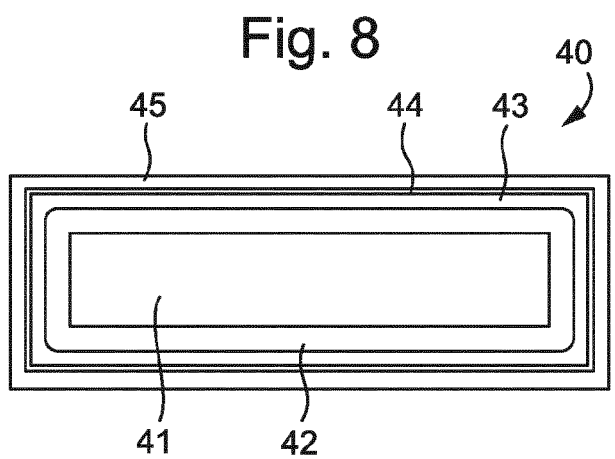

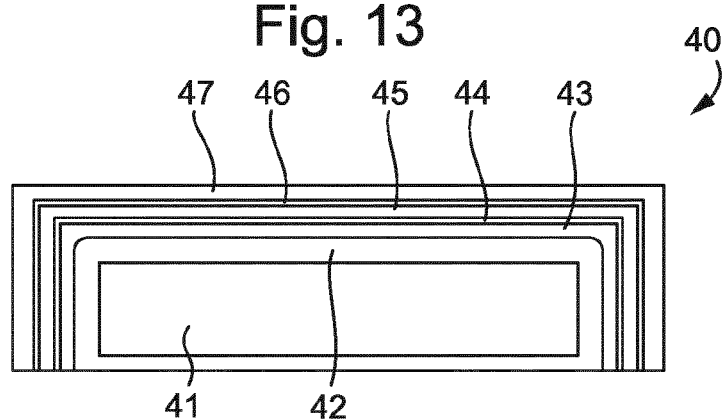
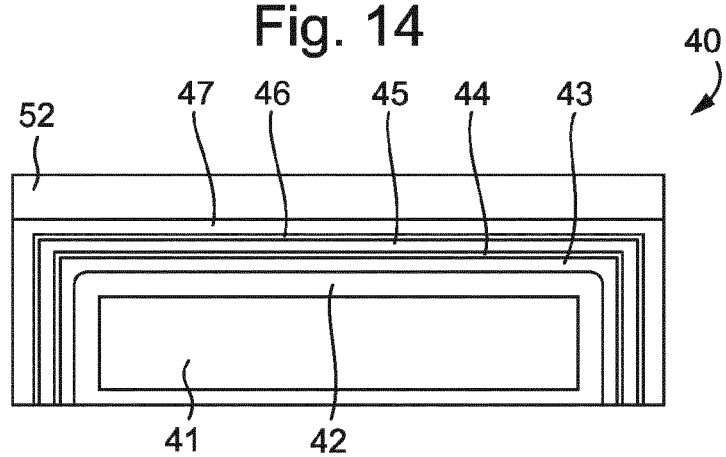
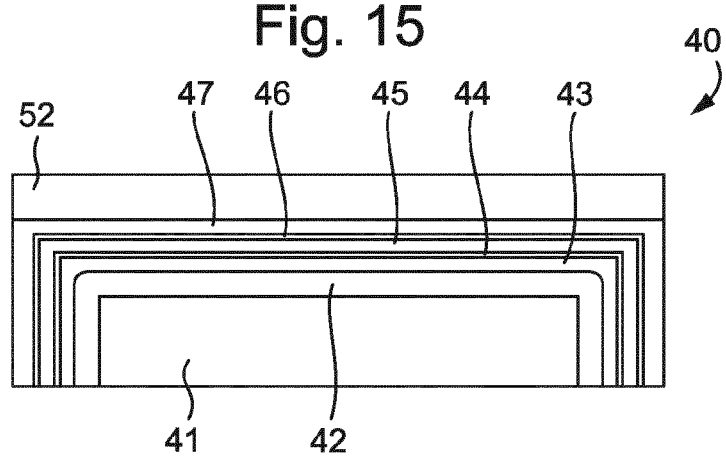

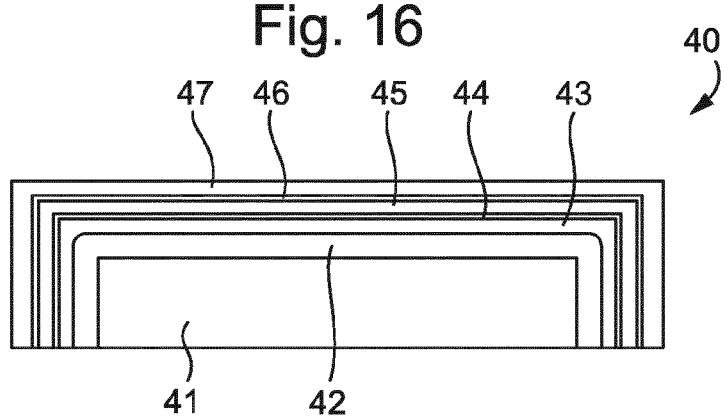
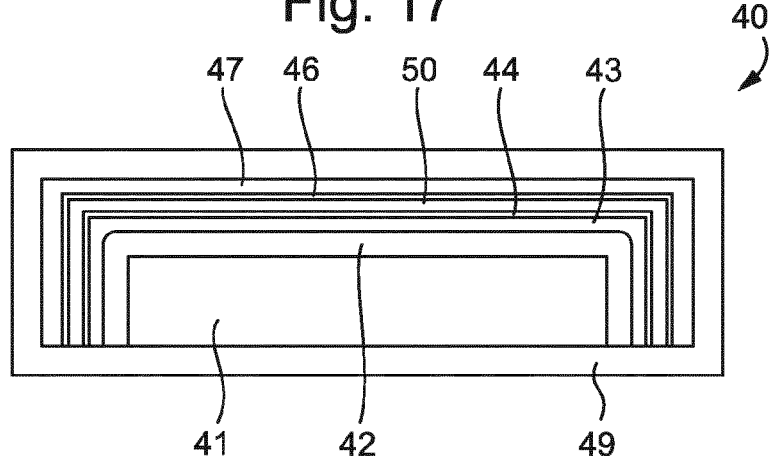
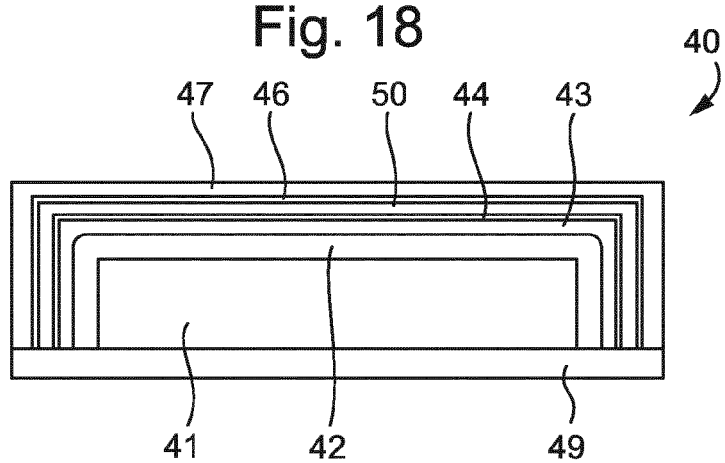

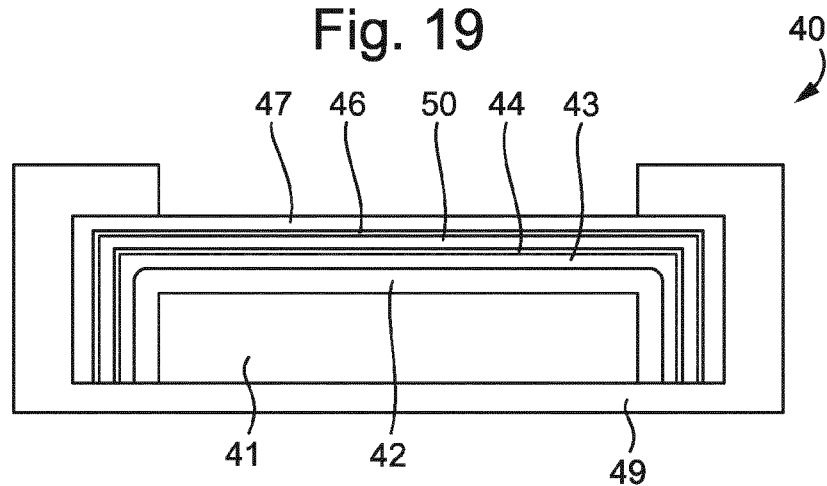
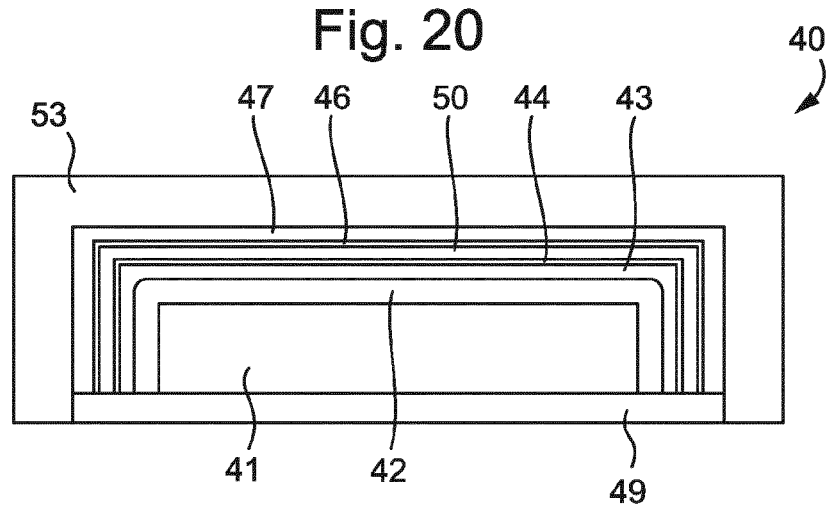
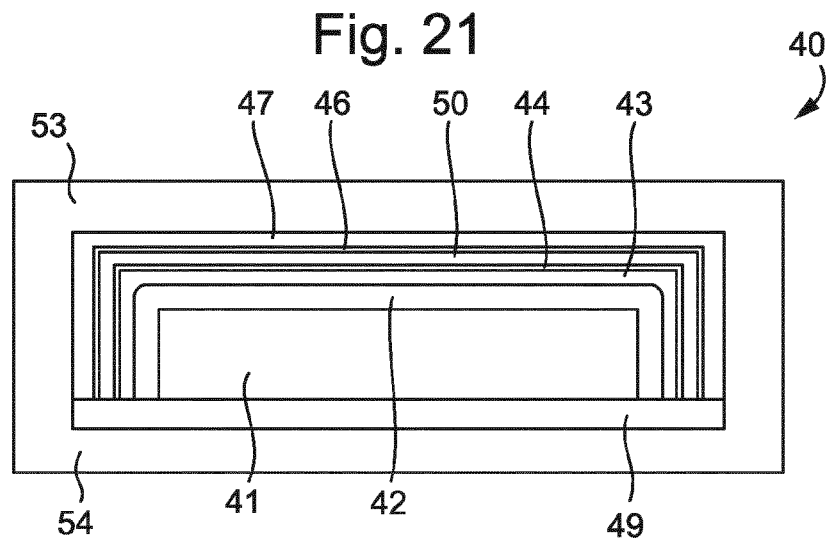

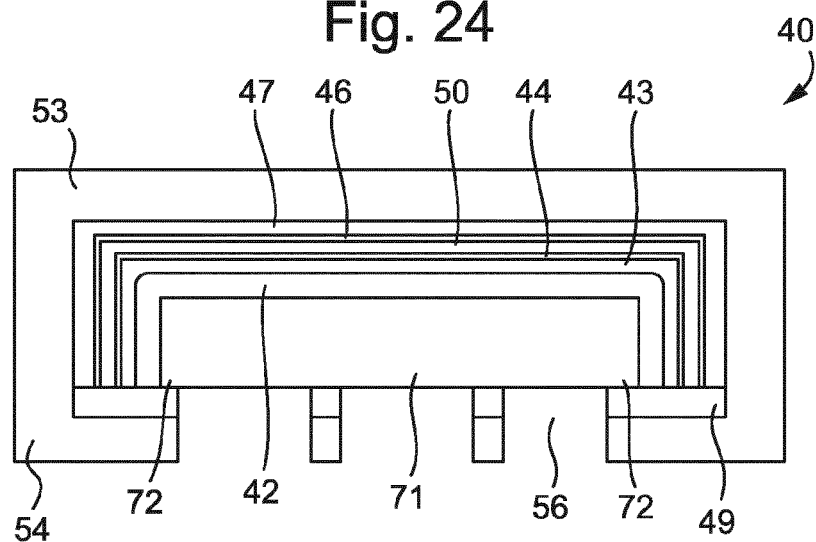
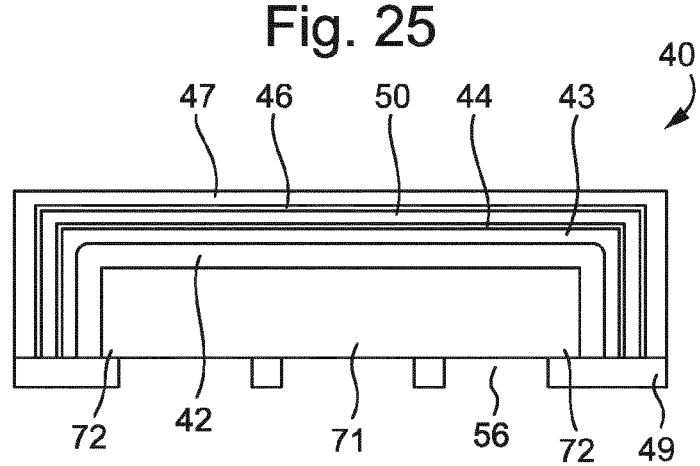
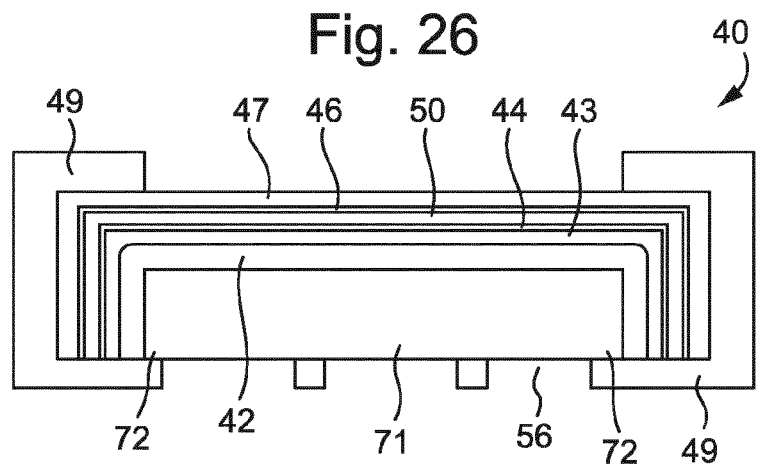

METHOD FOR MANUFACTURING A MEMBRANE ASSEMBLY

This application is a divisional of U.S. patent application Ser. No. 15/743,275, which was filed on Jan. 9, 2018, now allowed, which is the U.S. national phase entry of PCT patent application no. PCT/EP2016/065703, which was filed on Jul. 4, 2016, which claims the benefit of priority of European patent application no. 15177332.2, which was filed on Jul. 17, 2015, each of the foregoing applications is incorporated herein in its entirety by reference.

FIELD

The present disclosure relates to a method for manufacturing a membrane assembly, and to a membrane assembly.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \lambda / NA \quad (1)$$

where $\lambda$ is the wavelength of the radiation used, NA is the numerical aperture of the projection system used to print the pattern, k1 is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of k1.

In order to shorten the exposure wavelength and, thus, reduce the minimum printable size, it has been proposed to use an extreme ultraviolet (EUV) radiation source. EUV radiation is electromagnetic radiation having a wavelength within the range of 10-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

A lithographic apparatus includes a patterning device (e.g. a mask or a reticle). Radiation is provided through or reflected off the patterning device to form an image on a substrate. A membrane assembly may be provided to protect the patterning device from airborne particles and other forms of contamination. The membrane assembly for protecting the patterning device may be called a pellicle. Contamination on the surface of the patterning device can cause manufacturing defects on the substrate. The membrane assembly may comprise a border and a membrane stretched across the border. It is difficult to manufacture the membrane assembly without the membrane assembly being deformed in the process, for example because of the thinness of the membrane. Especially when the membrane in the membrane assembly is only supported at the border, with no other support or reinforcement means such as a grid or a substrate beneath the membrane to provide additional mechanical strength, then the membrane assembly may become more easily deformable. Furthermore, pellicle assemblies with a large membrane area as required for a lithographic patterning device are very likely to deform under stress. Deformation of the membrane assembly may lead to reduced performance, membrane damaging or even breakup, which is undesired.

It is desirable to reduce the possibility of a membrane assembly such as a pellicle being deformed or damaged during its manufacture.

SUMMARY

According to an aspect of the invention, there is provided a method for manufacturing a membrane assembly for EUV lithography, the method comprising: providing a stack comprising a planar substrate and at least one membrane layer, wherein the planar substrate comprises an inner region and a border region around the inner region; and selectively removing the inner region of the planar substrate, such that the membrane assembly comprises: a membrane formed from the at least one membrane layer; and a border holding the membrane, the border formed from the border region of the planar substrate; wherein the stack is provided with a mechanical protection material configured to mechanically protect the border region during the step of selectively removing the inner region of the planar substrate.

According to an aspect of the invention, there is provided a membrane assembly for EUV lithography, the membrane assembly comprising: a membrane formed from at least one membrane layer comprising polycrystalline silicon or monocrystalline silicon; and a border holding the membrane; wherein the membrane is capped by an upper capping layer and a lower capping layer, each of the upper capping layer and the lower capping layer comprising at least one of Ru, Zr, Mo, a silicon oxide, a zirconium oxide, an aluminum oxide, boron nitride, a ruthenium oxide, a ruthenium nitride, a zirconium nitride, a molybdenum oxide or a molybdenum nitride or a molybdenum silicide, wherein the border is formed from a planar substrate comprising an inner region and a border region around the inner region, wherein the border is formed by selectively removing the inner region of the planar substrate, wherein the planar substrate comprises an oxidized layer and a non-oxidized layer, such that the border comprises the oxidized layer and the non-oxidized layer, wherein the oxidized layer is between the non-oxidized layer and the at least one membrane layer, wherein the border comprises a mask layer, wherein the border region of the planar substrate is between the mask layer and the at least one membrane layer.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 4 to 37 schematically depict stages of a method for manufacturing a pellicle according to an embodiment of the invention;

Figure 1:
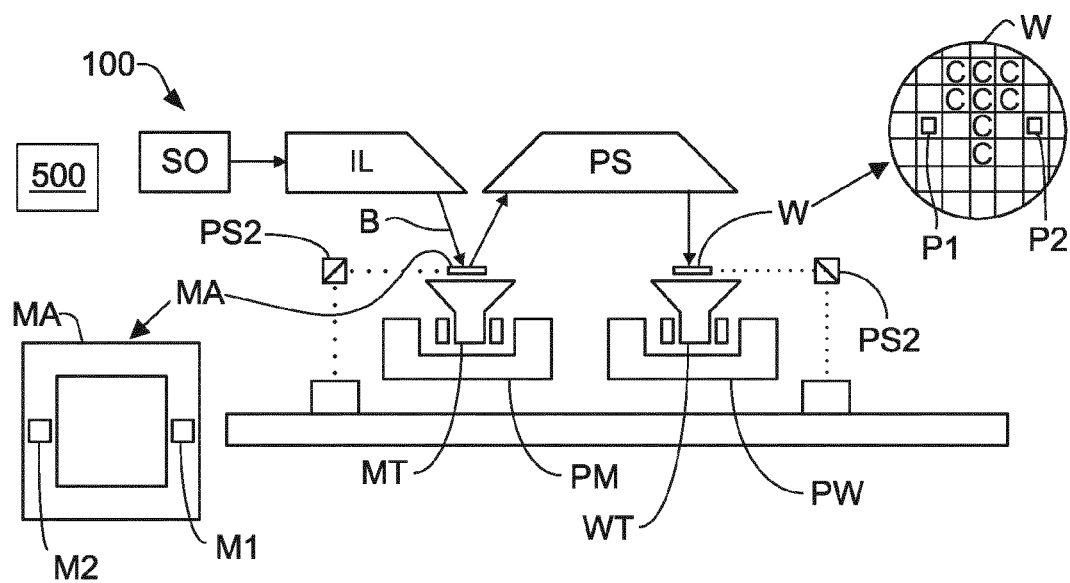
FIG. 1 depicts a lithographic apparatus according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

FIG. 1 schematically depicts a lithographic apparatus 100 including a source collector module SO according to one embodiment of the invention. The apparatus 100 comprises:
  an illumination system (or illuminator) IL configured to condition a radiation beam B (e.g., EUV radiation).
  a support structure (e.g., a mask table) MT constructed to support a patterning device (e.g., a mask or a reticle) MA and connected to a first positioner PM configured to accurately position the patterning device;
  a substrate table (e.g., a wafer table) WT constructed to hold a substrate (e.g., a resist-coated wafer) W and connected to a second positioner PW configured to accurately position the substrate; and
  a projection system (e.g., a reflective projection system) PS configured to project a pattern imparted to the radiation beam B by patterning device MA onto a target portion C (e.g., comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS.

The term "patterning device" should be broadly interpreted as referring to any device that can be used to impart a radiation beam B with a pattern in its cross-section such as to create a pattern in a target portion C of the substrate W. The pattern imparted to the radiation beam B may correspond to a particular functional layer in a device being created in the target portion C, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The projection system PS, like the illumination system IL, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the lithographic apparatus 100 is of a reflective type (e.g., employing a reflective mask).

The lithographic apparatus 100 may be of a type having two (dual stage) or more substrate tables WT (and/or two or more support structures MT). In such a "multiple stage" lithographic apparatus the additional substrate tables WT (and/or the additional support structures MT) may be used in parallel, or preparatory steps may be carried out on one or more substrate tables WT (and/or one or more support structures MT) while one or more other substrate tables WT (and/or one or more other support structures MT) are being used for exposure.

Referring to FIG. 1, the illumination system IL receives an extreme ultra violet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module SO may be separate entities, for example when a $CO_2$ laser is used to provide the laser beam for fuel excitation.

In such cases, the laser is not considered to form part of the lithographic apparatus 100 and the radiation beam B is passed from the laser to the source collector module SO with the aid of a beam delivery system comprising, for example, suitable directing mirrors and/or a beam expander. In other cases the source may be an integral part of the source collector module SO, for example when the source is a discharge produced plasma EUV generator, often termed as a DPP source.

The illumination system IL may comprise an adjuster for adjusting the angular intensity distribution of the radiation beam. Generally, at least the outer and/or inner radial extent (commonly referred to as □-outer and □-inner, respectively) of the intensity distribution in a pupil plane of the illumination system IL can be adjusted. In addition, the illumination system IL may comprise various other components, such as facetted field and pupil mirror devices. The illumination system IL may be used to condition the radiation beam B, to have a desired uniformity and intensity distribution in its cross-section.

The radiation beam B is incident on the patterning device (e.g., mask) MA, which is held on the support structure (e.g., mask table) MT, and is patterned by the patterning device MA. After being reflected from the patterning device (e.g., mask) MA, the radiation beam B passes through the projection system PS, which focuses the radiation beam B onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. The patterning device (e.g., mask) MA and the substrate W may be aligned using mask alignment marks M1, M2 and substrate alignment marks P1, P2.

A controller 500 controls the overall operations of the lithographic apparatus 100 and in particular performs an operation process described further below. Controller 500 can be embodied as a suitably-programmed general purpose computer comprising a central processing unit, volatile and non-volatile storage means, one or more input and output devices such as a keyboard and screen, one or more network connections and one or more interfaces to the various parts of the lithographic apparatus 100. It will be appreciated that a one-to-one relationship between controlling computer and lithographic apparatus 100 is not necessary. In an embodiment of the invention one computer can control multiple lithographic apparatuses 100. In an embodiment of the invention, multiple networked computers can be used to control one lithographic apparatus 100. The controller 500 may also be configured to control one or more associated process devices and substrate handling devices in a lithocell or cluster of which the lithographic apparatus 100 forms a part. The controller 500 can also be configured to be subordinate to a supervisory control system of a lithocell or cluster and/or an overall control system of a fab.

Figure 2:
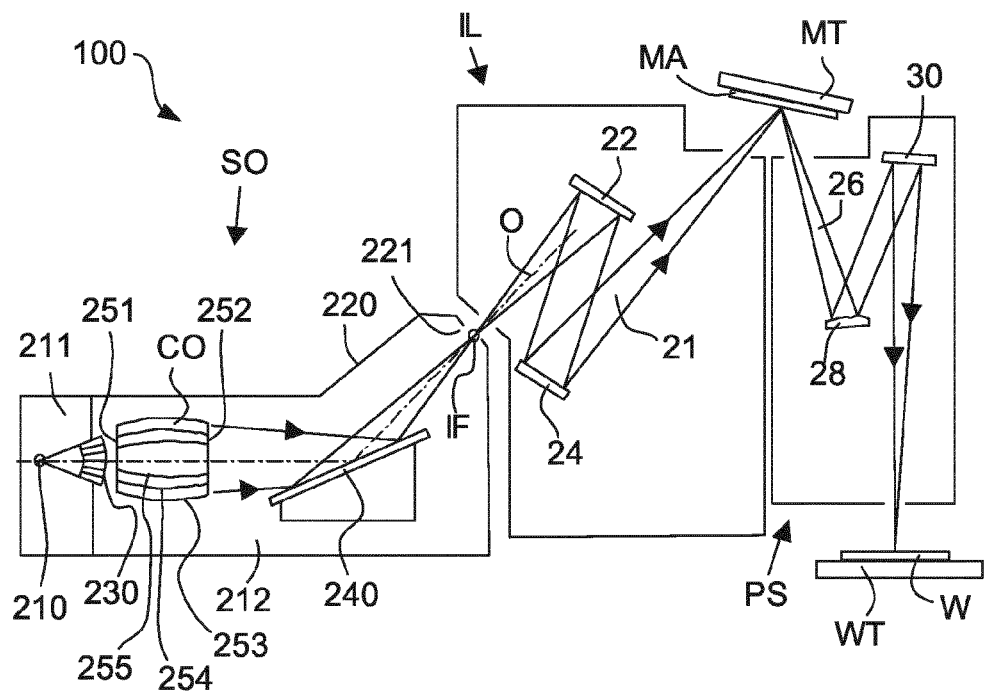
FIG. 2 is a more detailed view of the lithographic apparatus.

FIG. 2 shows the lithographic apparatus 100 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the radiation emitting plasma 210 is created to emit radiation in the EUV range of the electromagnetic spectrum. The radiation emitting plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the radiation emitting plasma 210 is passed from a source chamber 211 into a collector chamber 212 via an optional gas barrier or contaminant trap 230 (in some cases also referred to as contaminant barrier or foil trap) that is positioned in or behind an opening in source chamber 211. The contaminant trap 230 may include a channel structure. The contamination trap 230 may also include a gas barrier or a combination of a gas barrier and a channel structure. The contaminant trap 230 further indicated herein at least includes a channel structure, as known in the art.

The collector chamber 212 may include a radiation collector CO, which may be a so-called grazing incidence collector. The radiation collector CO has an upstream radiation collector side 251 and a downstream radiation collector side 252. Radiation that traverses the radiation collector CO can be reflected off a grating spectral filter 240 to be focused in a virtual source point IF. The virtual source point IF is commonly referred to as the intermediate focus, and the source collector module SO is arranged such that the virtual source point IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the unpatterned beam 21, at the patterning device MA, as well as a desired uniformity of radiation intensity at the patterning device MA. Upon reflection of the unpatterned beam 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in the illumination system IL and the projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 2.

The radiation collector CO, as illustrated in FIG. 2, is depicted as a nested collector with grazing incidence reflectors 253, 254 and 255, just as an example of a radiation collector CO. The grazing incidence reflectors 253, 254 and 255 are disposed axially symmetric around an optical axis O and a radiation collector CO of this type is preferably used in combination with a discharge produced plasma source, often called a DPP source.

Figure 3:
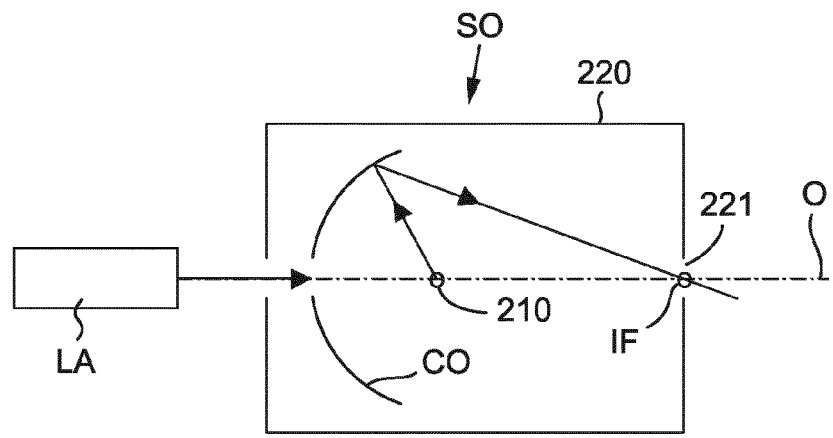
FIG. 3 is a more detailed view of the source collector module of the apparatus of FIGS. 1 and 2.

Alternatively, the source collector module SO may be part of an LPP radiation system as shown in FIG. 3. A laser LA is arranged to deposit laser energy into a fuel, such as xenon (Xe), tin (Sn) or lithium (Li), creating the radiation emitting plasma 210 with electron temperatures of several 10's of eV. The energetic radiation generated during de-excitation and recombination of these ions is emitted from the plasma, collected by a near normal incidence radiation collector CO and focused onto the opening 221 in the enclosing structure 220.

As depicted in FIG. 1, in an embodiment the lithographic apparatus 100 comprises an illumination system IL and a projection system PS. The illumination system IL is configured to emit a radiation beam B. The projection system PS is separated from the substrate table WT by an intervening space. The projection system PS is configured to project a pattern imparted to the radiation beam B onto the substrate W. The pattern is for EUV radiation of the radiation beam B.

The space intervening between the projection system PS and the substrate table WT can be at least partially evacuated. The intervening space may be delimited at the location of the projection system PS by a solid surface from which the employed radiation is directed toward the substrate table WT.

In an embodiment the lithographic apparatus 100 comprises a dynamic gas lock. The dynamic gas lock comprises a membrane assembly 80. In an embodiment the dynamic gas lock comprises a hollow part covered by a membrane assembly 80 located in the intervening space. The hollow part is situated around the path of the radiation. In an embodiment the lithographic apparatus 100 comprises a gas blower configured to flush the inside of the hollow part with a flow of gas. The radiation travels through the membrane assembly 80 before impinging on the substrate W.

In an embodiment the lithographic apparatus 100 comprises a membrane assembly 80. As explained above, in an embodiment the membrane assembly 80 is for a dynamic gas lock. In this case the membrane assembly 80 functions as a filter for filtering DUV radiation. Additionally or alternatively, in an embodiment the membrane assembly 80 is pellicle for the patterning device MA for EUV lithography. The membrane assembly 80 of an embodiment of the present invention can be used for a dynamic gas lock or for a pellicle or for another purpose. In an embodiment the membrane assembly 80 comprises a membrane formed from the at least one membrane layer 50 configured to transmit at least 80% of incident EUV radiation. In order to ensure maximized EUV transmission and minimized impact on imaging performance it is preferred that the membrane is only supported at the border. The area of the membrane is preferably in the range of from 500 to 25.000 mm$^2$, more preferably in range from 800 to 20.000 mm$^2$, even more preferably from 1.000 to 18.500 mm$^2$.

In an embodiment the pellicle is configured to seal off the patterning device MA to protect the patterning device MA from airborne particles and other forms of contamination. Contamination on the surface of the patterning device MA can cause manufacturing defects on the substrate W. For example, in an embodiment the pellicle is configured to reduce the likelihood that particles might migrate into a stepping field of the patterning device MA in the lithographic apparatus 100, i.e. in order to prevent landing of the particles on the imaging surface of the patterning device MA.

If the patterning device MA is left unprotected, the contamination can require the patterning device MA to be cleaned or discarded. Cleaning the patterning device MA interrupts valuable manufacturing time and discarding the patterning device MA is costly. Replacing the patterning device MA also interrupts valuable manufacturing time.

Figure 4:
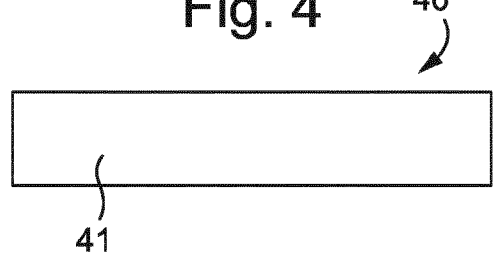

FIGS. 4 to 37 schematically depict stages of a method for manufacturing the membrane assembly 80 according to an embodiment of the invention. In an embodiment the method for manufacturing the membrane assembly 80 comprises providing a stack 40. As depicted in FIG. 4, the stack 40 comprises a planar substrate 41. The stack may also comprise several other layers of materials deposited on the planar surface 41, the layers having various protective functions in the manufacturing process of the mask assembly 80, or for enhancement of the characteristics of the membrane assembly 80, such as resistance to chemicals/environment and/or improved (thermo-)mechanical strength and/or reduced imaging impact (e.g. by reducing pellicle reflections).

In an embodiment the planar substrate 41 is formed from silicon. The planar substrate 41 has a shape such as a square, a circle or a rectangle, for example. The shape of the planar substrate 41 is not particularly limited. The size of the planar substrate 41 is not particularly limited. For example, in an embodiment the planar substrate 41 has a diameter in the range of from about 100 mm to about 500 mm, for example about 200 mm. The thickness of the planar substrate 41 is not particularly limited. For example, in an embodiment the planar substrate 41 has a thickness of at least 300 µm, optionally at least 400 µm. In an embodiment the planar substrate 41 has a thickness of at most 1,000 µm, optionally at most 800 µm. In an embodiment the planar substrate 41 has a thickness of about 725 µm.

Silicon can crystallize in a diamond cubic crystal structure. In an embodiment the planar substrate 41 comprises a cubic crystal of silicon. In an embodiment the planar substrate 41 has a <100> crystallographic direction.

In an embodiment the method for manufacturing the membrane assembly 80 comprises a step of etching the planar substrate 41. An embodiment of the invention is expected to achieve a reduction in time required to perform the step of etching the planar substrate 41. Part of the planar substrate 41 referred further herein as a border region 72 forms (after removal of an inner region of the planar substrate) part of a border 75 of the membrane assembly 80, as depicted for example in FIGS. 37 and 38. The border 75 holds the membrane of the membrane assembly 80. An embodiment of the invention is expected to achieve increased mechanical strength of the border 75 of the membrane assembly 80. The border 75 is formed at least partly by the planar substrate 41. The border 75 may be called a membrane assembly carrier.

In an embodiment the planar substrate 41 is polished. The stack 40 has a top side and a bottom side. The top side is depicted at the top of the stack 40 in FIGS. 4 to 41. The bottom side is depicted at the bottom of the stack 40 in FIGS. 4 to 41. In an embodiment the planar substrate 41 is polished at both the top side and the bottom side. However, this is not necessarily the case. In an embodiment the planar substrate 41 is polished on only one of the top side and the bottom side.

Figure 5:
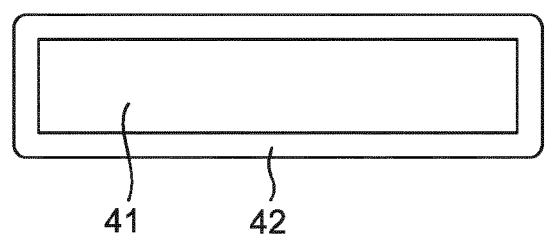
Figure 33:
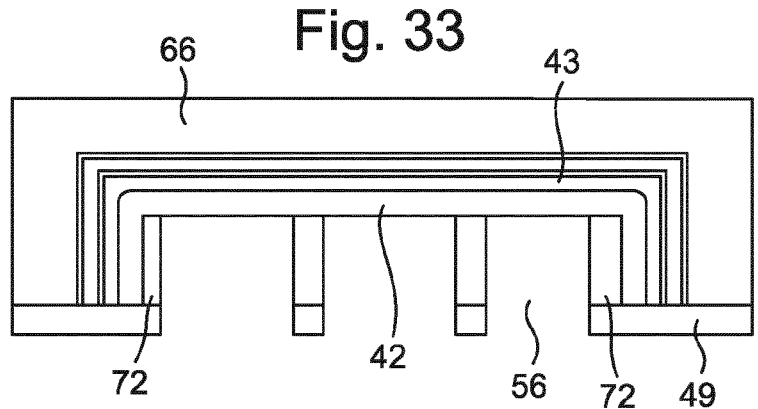

As depicted in FIG. 5, in an embodiment the planar substrate 41 comprises an oxidized layer 42. The oxidized layer 42 is part of the planar substrate 41. The rest of the planar substrate 41 forms a non-oxidized layer of the planar substrate 41. The oxidized layer 42 is a sacrificial layer. The oxidized layer 42 forms an etch barrier when the non-oxidized layer of the planar substrate 41 is etched. As depicted in FIG. 33, for example, the planar substrate 41 is etched from the bottom side. The oxidized layer 42 is resistant to the etchant.

In an embodiment the oxidized layer 42 has a thickness greater than 100 nm, optionally greater than 200 nm, and optionally greater than 300 nm. For example, in an embodiment the oxidized layer 42 has a thickness of about 350 nm or about 400 nm. In an embodiment the oxidized layer has a thickness less than 5 µm and preferably less than 1 µm. An embodiment of the invention is expected to achieve an improved robustness to the step of etching the planar substrate 41.

In an embodiment the oxidized layer 42 is formed as a thin layer of oxide on outer surfaces of the planar substrate 41. In an embodiment the oxidized layer 42 is formed by a thermal oxidation process, for example as a thermal wet oxide. In an embodiment the oxidized layer 42 and the etchant used for etching the planar substrate 41 are configured such that the etch rate of the oxidized layer 42 in the etchant is less than about 5 nm/minute, for example about 3 nm/minute. In an embodiment the oxidized layer 42 comprises amorphous silicon dioxide.

Figure 38:
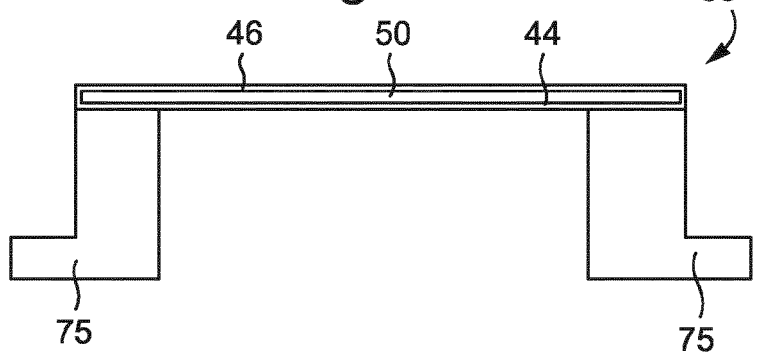
FIGS. 38 and 39 depict a pellicle according to an embodiment of the invention.
Figure 39:
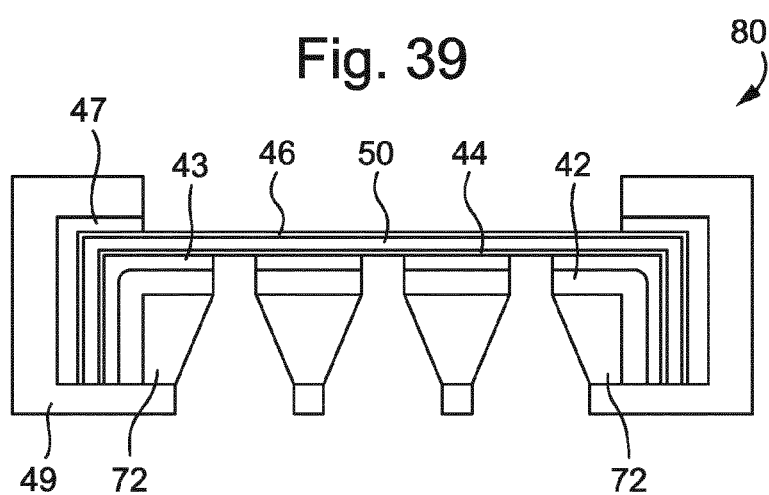

As depicted in FIGS. 9 to 37, the stack 40 comprises at least one membrane layer 45, 50. As depicted in FIGS. 38 and 39, the membrane assembly 80 comprises a membrane formed from the at least one membrane layer 50. In an embodiment at least one membrane layer 50 comprises polycrystalline silicon. In an embodiment the polycrystalline silicon is formed by crystallizing amorphous silicon in the at least one membrane layer 45. For example, as depicted in FIG. 8, in an embodiment a membrane layer 45 is added to the stack 40 as an amorphous silicon layer. The amorphous silicon layer crystallizes into a polycrystalline silicon layer when temperature increases. For example, as shown in the transition from FIG. 16 to FIG. 17, the membrane layer 45 shown in FIG. 16 as an amorphous silicon layer transforms into the membrane layer 50 shown in FIG. 17 as a polycrystalline silicon layer.

In an embodiment polycrystalline silicon layer is in-situ doped during its growth. By adding a p or n-type dope the silicon conductivity increases, which has a positive effect on handling the power of the EUV source.

As depicted in FIG. 6, in an embodiment the stack 40 comprises a lower sacrificial layer 43. The lower sacrificial layer 43 is disposed between the planar substrate 41 and the at least one membrane layer 45, 50. When the planar substrate 41 comprises an oxidized layer 42, the lower sacrificial layer 43 is disposed between the oxidized layer 42 and the at least one membrane layer 45, 50.

In an embodiment the planar substrate 41 comprises an inner region 71 and a border region 72. The border region 72 is around the inner region 71. The inner region 71 and the border region 72 are in the plane of the planar substrate 41. In an embodiment the border region 72 surrounds the inner region 71 in the plane of the planar substrate 41.

In an embodiment the method for manufacturing the membrane assembly 80 comprises selectively removing an inner region 71 of the planar substrate 41. In an embodiment the non-oxidized layer of the planar substrate 41 is selectively removed using a wet etchant such as potassium hydroxide (KOH). Alternatively the non-oxidized layer of the planar substrate 41 is selectively removed by a dry etching process, or by any known way to remove the non-oxidized layer of the planar substrate 41. The oxidized layer 42 of the planar substrate 41 is resistant to the etchant used to selectively remove the inner region 71 of the non-oxidized layer of the planar substrate 41.

Figure 35:
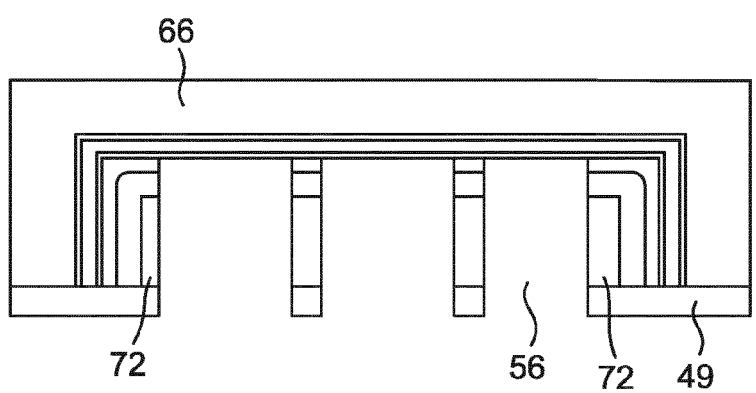

As shown in FIG. 35, any layer such as the oxidized layer 42 of the planar substrate 41 present at the bottom of the membrane is selectively removed. Any suitable method can be used to perform the selective removal so as to free the bottom of the membrane.

The lower sacrificial layer 43 protects the at least one membrane layer 45, 50 during the selective removal of any layer such as the oxidized layer 42 of the planar substrate 41 present at the bottom of the membrane.

The thickness of the lower sacrificial layer 43 is not particularly limited. In an embodiment the thickness of the lower sacrificial layer 43 is at least about 5 nm, and optionally at least about 10 nm. In an embodiment the thickness of the lower sacrificial layer 43 is at most about 100 nm, and optionally at most about 50 nm. In an embodiment the thickness of the lower sacrificial layer 43 is about 20 nm.

Figure 12:
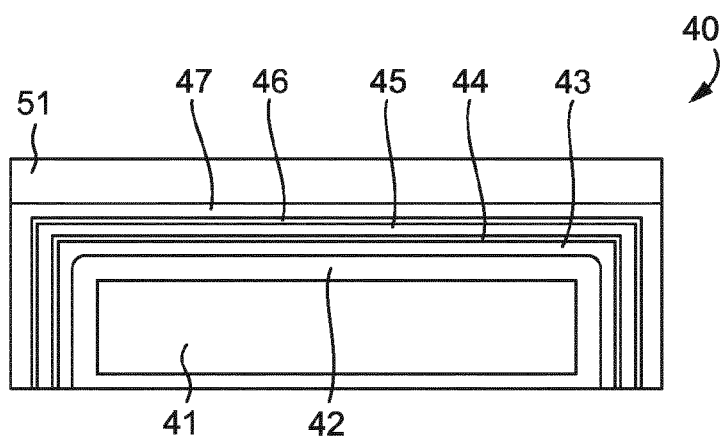

In an embodiment the lower sacrificial layer 43 is provided to both the top surface and the bottom surface of the stack 40, as shown in FIG. 6. The lower sacrificial layer 43 can be removed from the bottom surface of the stack 40 in a later process step, for example as shown in FIG. 12. However, this is not necessarily the case. In an alternative embodiment the lower sacrificial layer 43 is applied only to the top surface of the stack 40 or only to the bottom of the stack 40. The lower sacrificial layer 43 at the top surface of the stack 40 is positioned between the planar substrate 41 and the membrane layer 45, 50 that forms the membrane of the membrane assembly 80.

In an embodiment the lower sacrificial layer 43 is formed from a material such as amorphous silicon. However, this is not necessarily the case.

The method of depositing the lower sacrificial layer 43 onto the stack 40 is not particularly limited. In an embodiment the lower sacrificial layer 43 is applied to the stack 40 by chemical vapor deposition. For example, in an embodiment the lower sacrificial layer 43 is applied to the stack 40 by low pressure chemical vapor deposition at a temperature in a range from 300 to 700° C. However, this is not necessarily the case. For example, in an alternative embodiment the lower sacrificial layer 43 is applied to the stack 40 by a sputtering method or by a thin filming method, for example.

As depicted in FIG. 7, in an embodiment the stack 40 comprises a lower capping layer 44. The lower capping layer 44 is disposed between the planar substrate 41 and the membrane layer 45, 50. When the stack 40 comprises the lower sacrificial layer 43, the lower capping layer 44 is disposed between the lower sacrificial layer 43 and the membrane layer 45, 50. As shown in FIG. 38 and FIG. 39, in an embodiment the lower capping layer 44 forms part of the membrane of the membrane assembly 80 produced by the method according to an embodiment of the invention.

Figure 9:
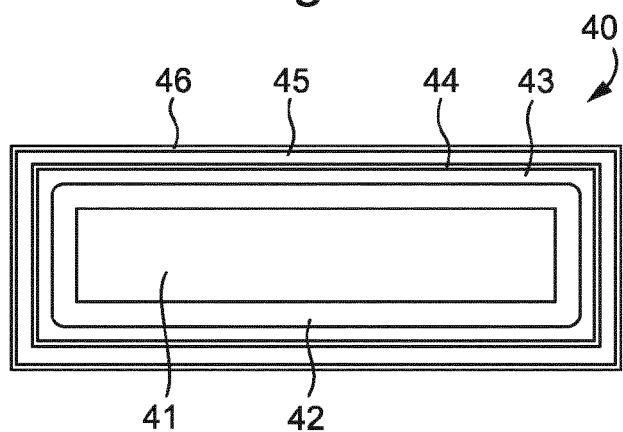

The lower capping layer 44 is configured to contain the membrane layer 50 of the membrane of the membrane assembly 80 produced by the manufacturing method. This is particularly the case when an upper capping layer 46 is provided in addition to the lower capping layer 44, as shown in FIG. 9, for example. The lower capping layer 44 and the upper capping layer 46 are configured to reduce the distribution of debris when the membrane of the membrane assembly 80 breaks.

In an embodiment, each of the lower capping layer 44 and the upper capping layer 46 has a thickness of less than 3 nm. In an embodiment the combined thickness of the lower capping layer 44, the membrane layer 45 and the upper capping layer 46 is approximately 50 nm.

During use of the lithographic apparatus 100, it is possible for the membrane assembly 80 to break. When the membrane assembly 80 breaks, the membrane can break up into many particles. In particular, if the membrane layer 50 is formed from a material having a brittle nature, the membrane layer 50 can shatter into many particles when the membrane assembly 80 breaks. The debris from the broken membrane assembly 80 can contaminate other parts of the lithographic apparatus 100. For example, debris from the broken membrane assembly 80 can contaminate optical components of the lithographic apparatus 100. Contamination from the debris of the broken membrane assembly 80 can reduce the quality of optical functions carried out by the optical components of the lithographic apparatus 100.

For example, in an embodiment the membrane layer 50 is formed from polycrystalline silicon. Polycrystalline silicon has a brittle nature. Hence, a membrane assembly 80 comprising a membrane that comprises a membrane layer 50 formed from polycrystalline silicon can shatter into many particles when the membrane assembly 80 breaks. An embodiment of the invention is expected to achieve an improvement in the mechanical properties of the membrane assembly 80.

As depicted in FIG. 7, in an embodiment the lower capping layer 44 is applied to the top surface and the bottom surface of the stack 40. The lower capping layer 44 can be removed in a later process step as shown in FIG. 12. However, this is not necessarily the case. For example, in an alternative embodiment the lower capping layer 44 is applied only to the top surface of the stack 40. The lower capping layer 44 at the top surface of the stack 40 is disposed between the planar substrate 41 and the membrane layer 45, 50.

In an embodiment the material for the lower capping layer 44 is a low stress nitride (i.e. a nitride with a film stress, such as a tensile stress, of 300 MPa or lower). For example, in an embodiment the material for the lower capping layer 44 is an amorphous silicon nitride. However, other low stress nitrides may be suitable. In an embodiment the lower capping layer 44 is thick enough to allow the lower capping layer 44 to perform its function of containing the membrane layer 50 when the membrane assembly 80 breaks. In an embodiment the thickness of the lower capping layer 44 is at least about 1 nm, and optionally at least about 2 nm. In an embodiment the lower capping layer 44 is thin enough so that the membrane of the membrane assembly 80 including the lower capping layer 44 has sufficiently good optical properties, particularly for transmission of EUV radiation. In an embodiment the thickness of the lower capping layer 44 is at most about 10 nm, and optionally at most about 5 nm. In an embodiment the thickness of the lower capping layer 44 is about 2.5 nm.

The method of applying the lower capping layer 44 to the stack 40 is not particularly limited. In an embodiment the lower capping layer 44 is applied to the stack by chemical vapor deposition (CVD), for example low pressure chemical vapor deposition (LPCVD) at a temperature of about 850° C. However, in an alternative embodiment the lower capping layer 44 is applied to the stack 40 by a sputtering method or by a thin filming method, for example. In this context, the term low stress means that the lower capping layer 44 has a low tensile stress.

It is not necessary for the lower capping layer 44 to be provided. In an embodiment the stack 40 does not comprise any lower capping layer 44. In an embodiment the membrane assembly 80 produced by the manufacturing method does not comprise any lower capping layer 44.

FIG. 8 depicts the step in which the membrane layer 45 is applied to the stack 40. As depicted in FIG. 8, in an embodiment the membrane layer 45 is applied to both the top surface and the bottom surface of the stack 40. The membrane layer 45 can be removed from the bottom side of the stack 40 in a later process step, for example as shown in FIG. 12. However, this is not necessarily the case. In an alternative embodiment the membrane layer 45 is applied only to the top side of the stack 40. The membrane layer 45 at the top side of the stack 40 becomes the membrane layer 50 in the membrane of the membrane assembly 80 produced by the manufacturing method, as shown in FIG. 38 and FIG. 39.

In an embodiment the membrane layer 45 is applied to the stack 40 by a chemical vapor deposition method. For example, in an embodiment the membrane layer 45 is applied by low pressure chemical vapor deposition at a temperature of about 560° C. However, other methods such as a sputtering method and a thin filming method can be used. Exemplary apparatus suitable for performing a low pressure chemical vapor deposition method is explained further below with reference to FIG. 40.

In an embodiment the membrane layer 45 is thin enough that its transmission for EUV radiation is sufficiently high, for example greater than 50%. In an embodiment the thickness of the membrane layer 45 is at most about 200 nm, and optionally at most about 150 nm. A 150 nm thick pure Si membrane would transmit about 77% of incident EUV radiation. In an embodiment the thickness of the membrane layer 45 is at most about 100 nm. A 100 nm thick pure Si membrane would transmit about 84% of incident EUV radiation.

In an embodiment the membrane layer 45 is thick enough that it is mechanically stable when the membrane assembly 80 is fixed to the patterning device MA of the lithographic apparatus 100 and during use of the lithographic apparatus 100. In an embodiment the thickness of the membrane layer 45 is at least about 10 nm, optionally at least about 20 nm, and optionally at least about 35 nm. In an embodiment the thickness of the membrane layer 45 is about 55 nm.

As depicted in FIG. 9, in an embodiment the stack 40 comprises an upper capping layer 46. Features of the upper capping layer 46 can be selected and varied in the same manner as the features of the lower capping layer 44 described above with reference to FIG. 7. Accordingly, the features of the upper capping layer 46 will not be described in any further detail here.

The upper capping layer 46 is disposed such that the membrane layer 45, 50 is disposed between the planar substrate 41 and the upper capping layer 46. It is not necessary for the upper capping layer 46 to be provided. In an embodiment the stack 40 does not comprise any upper capping layer 46. In an embodiment the membrane assembly 80 produced by the manufacturing method does not comprise any upper capping layer 46 in the membrane of the membrane assembly 80.

Figure 10:
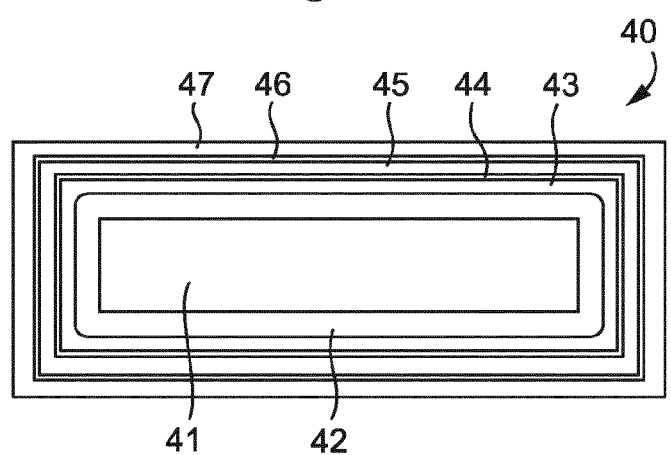

As depicted in FIG. 10, in an embodiment the stack 40 comprises an upper sacrificial layer 47. The upper sacrificial layer 47 is disposed such that the membrane layer 45, 50 is disposed between the planar substrate 41 and the upper sacrificial layer 47.

The other features relating to the upper sacrificial layer 47 can be selected and varied in the same way that the features of the lower sacrificial layer 43 can be selected and varied. The features of the lower sacrificial layer 43 were described above with particular reference to FIG. 6. Accordingly, the further features of the upper sacrificial layer 47 will not be discussed in any further detail here.

In an embodiment the stack 40 comprises a protective layer (not shown). The protective layer is applied to the stack 40 such that the membrane layer 45 is disposed between the planar substrate 41 and the protective layer. When the stack 40 is provided with the upper sacrificial layer 47, the upper sacrificial layer 47 is disposed between the membrane layer 45 and the protective layer.

Figure 11:
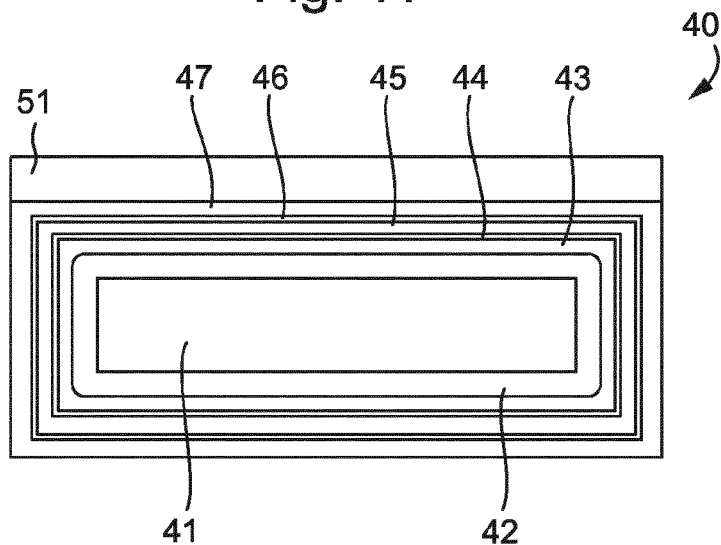

As depicted in FIG. 11, in an embodiment the method for manufacturing the membrane assembly 80 comprises applying a front side lacquer layer 51 to the top side of the stack 40. The front side lacquer layer 51 is configured to protect the layers at the top side of the stack 40 from a subsequent etching process that is performed on the bottom side of the stack 40.

In an embodiment the front side lacquer layer 51 has a thickness of about 2 µm or less. In an embodiment the front side lacquer layer is applied using a spin coating method.

As depicted in FIG. 12, in an embodiment the method for manufacturing the membrane assembly 80 comprises removing the membrane layer 45 from the bottom side of the stack 40. In an embodiment the step of removing the membrane layer 45 from the bottom side of the stack 40 further comprises removing the lower sacrificial layer 43, the lower capping layer 44, the upper capping layer 46 and/or the upper sacrificial layer 47 from the bottom side of the stack 40. Of course, if one or more of these layers is not provided at all or is not provided to the bottom side of the stack 40, then the step of removing the layer from the bottom side of the stack 40 is not necessary.

In an embodiment the step of removing the membrane layer 45 from the bottom side of the stack 40 is performed by a dry etching process. In an embodiment the dry etching process comprises exposing the membrane layer 45 to a bombardment of ions that dislodge portions of the membrane layer 45 from the exposed surface. In an embodiment the ions are from a plasma such as a fluorocarbon, e.g. tetrafluoromethane ($CF_4$). As depicted in FIG. 12, the dry etching process stops when the oxidized layer 42 of the planar substrate 41 at the bottom side of the stack 40 has been reached. If there is no oxidized layer 42 at the bottom side of the stack 40, then the dry etching process stops when the planar substrate 41 has been reached at the bottom side of the stack 40.

As depicted in FIG. 13, in an embodiment the method for manufacturing the membrane assembly 80 comprises removing the front side lacquer layer 51. In an embodiment the front side lacquer layer 51 is removed by an etching process. The front side lacquer layer 51 may have been damaged due to handling during the process of removing the nitride and silicon layers from the bottom side of the stack 40. Accordingly, the front side lacquer layer 51 can be replaced by first removing the front side lacquer layer 51.

As depicted in FIG. 14, in an embodiment the method for manufacturing the membrane assembly 80 comprises applying a replacement front side lacquer layer 52 to the top side of the stack 40. The replacement front side lacquer layer 52 is configured to protect the top side of the stack from an etching process applied to the bottom side of the stack 40. In an embodiment the thickness of the replacement front side lacquer layer 52 is about 2 µm or less. In an embodiment the replacement front side lacquer layer 52 is applied by a spin coat method.

However, it is not essential for the replacement front side lacquer layer 52 to be provided. For example, if the front side lacquer layer 51 has not been particularly damaged due to handling, then it may not be necessary to replace the front side lacquer layer 51 with the replacement front side lacquer layer 52. Alternatively, if there is no oxidized layer 42 at the bottom side of the stack 40, then it may not be necessary to provide the replacement front side lacquer layer 52 after the front side lacquer layer 51 has been removed.

As depicted in FIG. 15, in an embodiment the method for manufacturing the membrane assembly 80 comprises removing the oxidized layer 42 from the bottom side of the stack 40. In an embodiment the oxidized layer 42 is removed using a wet etching process. For example, in an embodiment the etchant may be a wet etchant such as buffered oxide etch. The etching process is stopped when the non-oxidized layer of the planar substrate 41 is expose at the bottom side of the stack 40.

As depicted in FIG. 16, in an embodiment the method for manufacturing the membrane assembly 80 comprises removing the replacement front side lacquer layer 52. In an embodiment the replacement front side lacquer layer 52 is removed by an etching process.

In an embodiment the method for manufacturing the membrane assembly 80 comprises selectively removing the inner region 71 of the planar substrate 41. As a result the membrane assembly 80 comprises a membrane from the membrane layer 50 and a border 75 holding the membrane. The border 75 is formed from the border region 72 of the planar substrate 41.

The border 75 improves the mechanical stability of the membrane of the membrane assembly 80. An embodiment of the invention is expected to achieve an improvement in the mechanical stability of the membrane assembly 80. This makes it easier to package and transport the membrane assembly 80 without the membrane assembly 80 being damaged. This also makes it easier for the membrane assembly 80 to be attached to the patterning device MA by a frame without the membrane assembly 80 being damaged.

In an embodiment the border 75 of the membrane assembly 80 is configured to be connected to the frame that connects the membrane assembly 80 to the patterning device MA. The frame does not need to be attached directly to the membrane of the membrane assembly 80. The frame can be attached to the border 75 of the membrane assembly 80. This reduces the possibility of the membrane of the membrane assembly 80 being damaged during the process of fitting the membrane assembly 80 to the patterning device MA.

As depicted in FIG. 17, in an embodiment the step of selectively removing the inner region 71 of the planar substrate 41 comprises depositing a mask material 49 to the top surface of the stack 40 and the bottom surface of the stack 40. In an embodiment the step of selectively removing the inner region 71 of the planar substrate 41 comprises selectively removing the mask material 49 such that a mask layer is formed from the mask material 49 deposited to the bottom surface of the stack 40 corresponding to the border region 72 of the planar substrate 41. In an embodiment the step of selectively removing the inner region 71 of the planar substrate 41 comprises anisotropically etching the inner region 71 of the planar substrate 41.

FIG. 17 schematically depicts the mask material 49 deposited to the top surface and the bottom surface of the stack 40. The mask material 49 is deposited such that the membrane layer 50 is disposed between the planar substrate 41 and the mask material 49.

The mask material 49 is used as a mask (i.e. as a mask layer), e.g. an etch barrier, for the process of etching the planar substrate 41 from the bottom side of the stack 40. As depicted in FIG. 17, the mask is provided by initially covering both the top surface and the bottom surface of the stack 40 with the mask material 49.

In an embodiment the mask material 49 comprises amorphous silicon nitride (e.g. a-$Si_3N_4$ or SiN). The mask material 49 is resistant to the means used to selectively remove the inner region 71 of the planar substrate 41. For example, in an embodiment a wet etchant such as KOH is used to selectively remove the inner region 71 of the planar substrate 41. Hence, in an embodiment the mask material 49 is chemically resistant to KOH.

In an embodiment the mask material 49 is thick enough to provide a robust etch barrier to the etchant used to selectively remove the inner region 71 of the planar substrate 41. In an embodiment the thickness of the mask material 49 is at least about 50 nm, and optionally at least about 100 nm. In an embodiment the mask material 49 is thin enough so as not to add significant bulk to the membrane assembly 80 produced by the manufacturing method. In particular, mask material 49 may remain as part of the border 75 at the bottom side of the membrane assembly 80 produced by the manufacturing method. In an embodiment the thickness of a mask material 49 is at most about 500 nm, and optionally at most about 200 nm. In an embodiment the thickness of the mask material 49 is about 120 nm.

In an embodiment the mask material 49 is deposited by chemical vapor deposition. For example, in an embodiment the mask material 49 is applied by low pressure chemical vapor deposition at a temperature of about 850° C.

By applying a high temperature, the nature of the membrane layer 45 can be changed. For example, when the membrane layer 45 is initially applied as amorphous silicon, the membrane layer 45 may be transformed into a membrane layer 50 formed of polycrystalline silicon. The temperature causes the amorphous silicon to crystallize into polycrystalline silicon.

Polycrystalline silicon has high transmission for EUV radiation. Polycrystalline silicon has good mechanical strength. It is easier to manufacture the membrane assembly 80 having a membrane formed from polycrystalline silicon than to fabricate a membrane formed of another material such as a multi-lattice material or even monocrystalline silicon (since monocrystalline silicon may have defects in the crystalline structure, such as pinholes). Polycrystalline silicon substantially filters EUV radiation.

However, it is not essential for the membrane of the membrane assembly 80 to be formed from polycrystalline silicon. For example, in an alternative embodiment the membrane of the membrane assembly 80 is formed from a multi-lattice membrane.

In a further alternative embodiment the membrane of the membrane assembly 80 is formed from monocrystalline silicon. In such an embodiment the monocrystalline silicon membrane can be formed by a silicon on insulator (SOI) technique. The starting material for this product is a so-called SOI substrate. An SOI substrate is a substrate comprising a silicon carrier substrate with a thin, monocrystalline silicon layer on top of a buried isolating SiO2 layer. In an embodiment the thickness of the monocrystalline silicon layer can range between about 5 nm to about 5 μm. In an embodiment the silicon membrane layer is present on the SOI substrate before the SOI substrate is used in the method of manufacture.

As depicted in FIG. 18, some of the mask material 49 may be removed at the upper side of the membrane. The mask material 49 may be removed by an etching process or any known removal method. Alternatively, in an embodiment the mask material 49 is provided only at the lower side of the membrane, in which case it is not necessary to remove any mask material 49 from the upper side of the membrane.

As depicted in FIG. 18, in an embodiment the step of removing the mask material 49 from the top surface of the stack 40 involves removing substantially all of the mask material 49 from the top surface and side surfaces of the stack 40. However, this need not necessarily be the case. As shown in FIG. 19, in an alternative embodiment, mask material 49 remains in a peripheral region of the top surface of the stack 50 and/or at the edge surfaces of the stack 40.

The mask material 49 at the peripheral region of the top surface of the stack 40 and at the edge surfaces of the stack 40 can form part of the border 75 of the membrane assembly 80 produced by the manufacturing method. The mask material 49 at the peripheral region of the top surface and at the edge surfaces of the stack 40 can also protect lower layers so that lower layers can also form part of the border 75 of the membrane assembly 80. An embodiment of the invention is expected to achieve an improvement in the mechanical strength of the border 75, leading to an improvement in the mechanical stability of the membrane assembly 80.

As depicted in FIG. 20, in an embodiment the step of selectively removing the mask material 49 from the bottom surface of the stack 40 comprises applying a front side mask lacquer layer 53 to the top side of the stack 40. In an embodiment the front side mask lacquer layer 53 has a thickness of about 3 μm or less. In an embodiment the front side mask lacquer layer 53 is applied by a spray coating method. The front side mask lacquer layer 53 is configured to protect the front side of the stack 40 from the etching process used to selectively remove the mask material 49 from the back surface of the stack 40.

As depicted in FIG. 21, in an embodiment the step of selectively removing the mask material 49 from the back surface of the stack 40 comprises applying a back side mask lacquer layer 54 to the back surface of the stack 40. In an embodiment the back side mask lacquer layer 54 has a thickness of about 3 μm or less. In an embodiment the back side mask lacquer layer 54 is applied by a spray coating method.

The back side mask lacquer layer 54 is configured to protect selective regions (e.g. corresponding to the border region 72 of the planar substrate 41) from the etching process used to selectively remove mask material 49 from the back surface of the stack 40.

Figure 22:
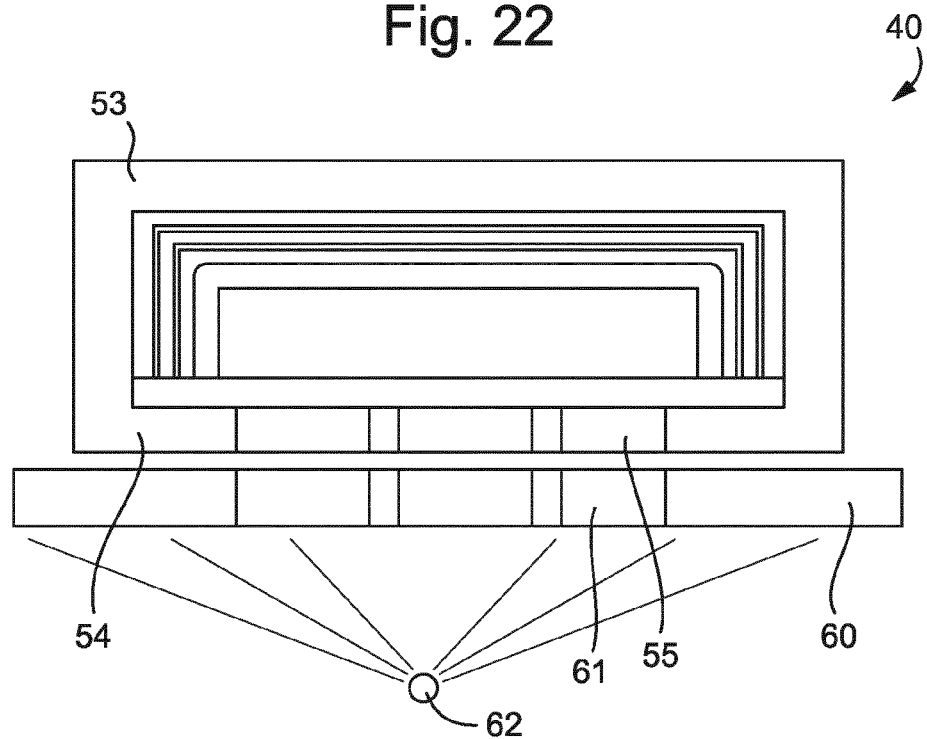

As depicted in FIG. 22, in an embodiment the step of selectively removing the mask material 49 from the back surface of the stack comprises exposing selected regions (e.g. corresponding to the inner region 71 of the planar substrate 41) of the back side mask lacquer layer 54. This exposure process is configured to define the membrane assembly areas. In an embodiment, multiple membrane assembly areas may be defined for a single substrate. A single substrate can be used to form multiple membrane assemblies 80.

As depicted in FIG. 22, in an embodiment an exposure mask 60 is provided so as to pattern the light eradiated onto the back side mask lacquer layer 54. The exposure mask 60 comprises mask openings 61. The mask openings 61 define regions or areas that will correspond to the inner region 71 of the planar substrate 41. The inner region 71 of the planar substrate 41 corresponds to the region in the membrane assembly 80 that has a membrane without the border 75 through which EUV radiation can be transmitted.

As depicted in FIG. 22, a radiation source 62 is provided. The radiation source 62 irradiates the back side mask lacquer layer 54 through the mask openings 61 of the exposure mask 60. Exposed regions 55 of the back side mask lacquer layer 54 are formed, as shown in FIG. 22.

Figure 23:
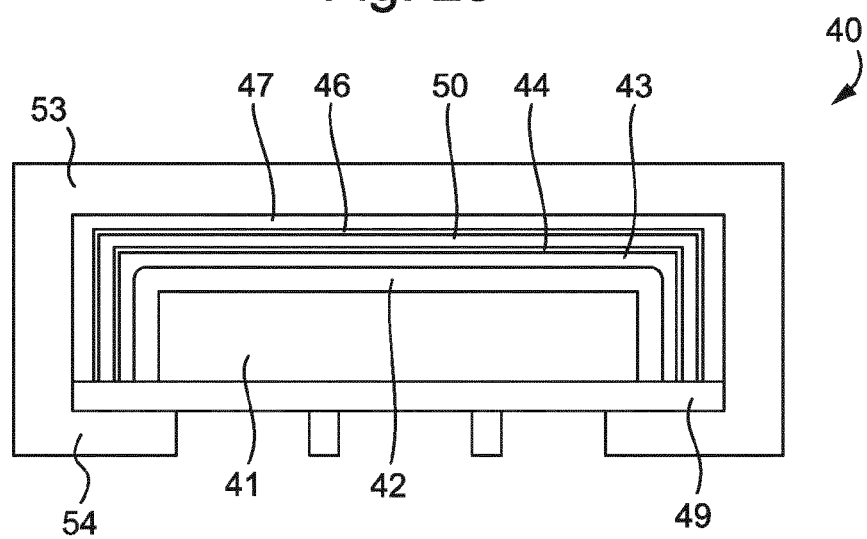

As depicted in FIG. 23, in an embodiment the step of selectively removing the mask material 49 from the back surface of the stack 40 comprises removing the exposed regions 55 of the back side mask lacquer layer 54. In an embodiment the exposed regions 55 are dissolved. It is to be noted that in the process of selectively removing the mask material 49 from the back surface of the stack 40, either a positive mask or a negative mask may be used.

As depicted in FIG. 24, in an embodiment the step of selectively removing the mask material 49 from the back surface of the stack 40 comprises etching the mask material 49 in regions corresponding to where the exposed regions 55 were removed (e.g. dissolved). When the exposed regions 55 are removed, an etch opening 56 is created in its place. The mask material 49 is removed in regions corresponding to the etch openings 56. The etch opening 56 extends into the region where the mask material 49 is removed from the back surface of the stack 40. In an embodiment the step of selectively removing the mask material 49 at regions of the back surface of the stack 40 corresponding to the etch opening 56 comprises dry etching the mask material 49.

As described above, in an embodiment the lower surface of the stack 40 is structured using a lithographic process and a dry etch process. Alternatively, in an embodiment an alternative structuring method is used to structure the lower surface of the stack 40.

As depicted in FIG. 25, in an embodiment the method for manufacturing the membrane assembly 80 comprises removing the front side mask lacquer layer 53 and the back side mask lacquer layer 54. After the step of selectively removing the mask material 49 has been completed, the front side mask lacquer layer 53 and the back side mask lacquer layer 54 are no longer required. The front side mask lacquer layer 53 and the back side mask lacquer layer 54 can be removed so that they do not interfere with the subsequent process steps.

As mentioned above with reference to FIG. 19, in an embodiment the mask material 49 remains in a peripheral region at the top surface of the stack 40 and/or at edge surfaces of the stack 40. As depicted in FIG. 26, in such an embodiment the mask material 49 remains in the peripheral region of the top surface and at the edge surfaces of the stack 40 after the front side mask lacquer layer 53 and the back side mask lacquer layer 54 have been removed.

Figure 27:
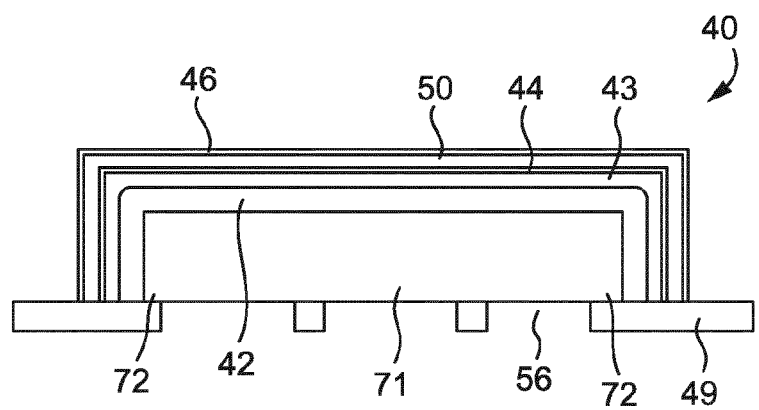

As depicted in FIG. 27, in an embodiment the method for manufacturing the membrane assembly 80 comprises removing any layer on the top of the membrane such as the upper sacrificial layer 47. As a result, the membrane is freed on the top side. Of course, if the sacrificial layer 47 was not provided, then the method does not comprise any step of removing the upper sacrificial layer 47.

Figure 28:
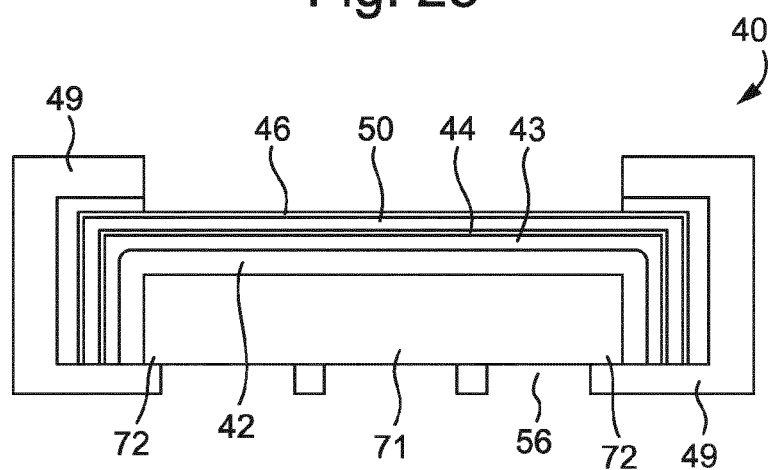

As mentioned above in relation to FIG. 19 and FIG. 26, in an embodiment the mask material 49 remains in a peripheral region of the top surface of the stack 40 and at edge surfaces of the stack 40. As depicted in FIG. 28, in such an embodiment the upper sacrificial layer 47 remains in the peripheral region at the top surface and at the edge surfaces of the stack 40 after the process of removing the upper sacrificial layer 47 has been completed. Hence, the step of removing the upper sacrificial layer 47 may not result in the entirety of the upper sacrificial layer 47 being removed.

As depicted in FIGS. 29 to 32, in an embodiment the method for manufacturing the membrane assembly 80 comprises providing the stack 40 with a mechanical protection material 66. The mechanical protection material 66 is configured to mechanically protect the border region 72 during the step of selectively removing the inner region 71 of the planar substrate 41. The step of selectively removing the inner region 71 of the planar substrate 41 can result in damage to the membrane assembly 80 during its manufacture. At this stage of the manufacturing method, the stack 40 is particularly thin. When the inner region 71 of the planar substrate 41 is selectively removed, the stack 40 comprises a mixture of extremely thin portions (where the inner region 71 has been removed) and thin portions (corresponding to the border 75 where the border region 72 of the planar substrate 41 has not been removed). This can result in mechanical stresses on the stack 40. It is possible for the stack 40 to break, or undesirably be damaged in other ways.

The mechanical protection material 66 mechanically protects the stack 40, particularly the border region 72, during the step of selectively removing the inner region 71 of the planar substrate 41. An embodiment of the invention is expected to achieve a reduced possibility of the membrane assembly 80 being damaged or destroyed during manufacture of the membrane assembly 80. An embodiment of the invention is expected to achieve an improved yield in the manufacturing of the membrane assembly 80.

Figure 29:
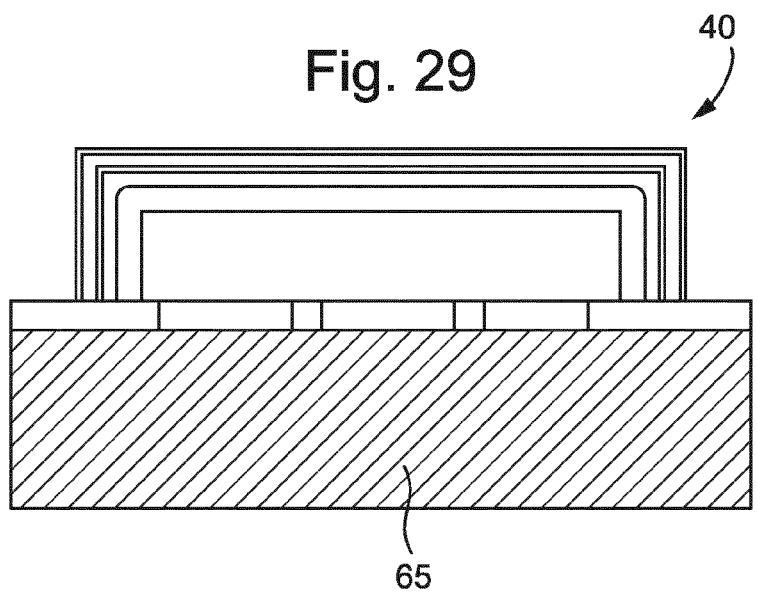

As depicted in FIG. 29, in an embodiment the step of providing the mechanical protection material 66 comprises applying a protection material mask 65 to the bottom surface of the stack 40. The protection material mask 65 covers substantially the whole of the bottom surface of the stack 40. The protection material mask 65 is configured to prevent the mechanical protection material 66 from coming into contact with the bottom surface of the stack 40. The possibility of the mechanical protection material 66 undesirably filling the etch openings 56 at the bottom surface of the stack 40 is reduced. In an embodiment the protection material mask 65 takes the form of a foil. The foil can be applied by a thin filming method, for example.

Figure 30:
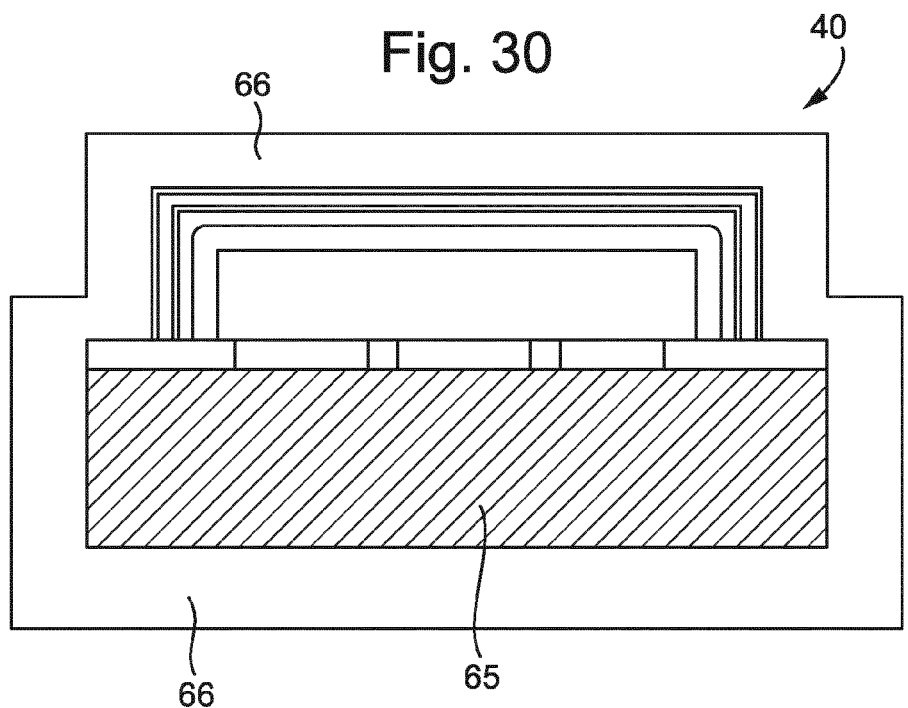

As depicted in FIG. 30, in an embodiment the step of providing the mechanical protection material 66 comprises surrounding the combination of the stack 40 and the protection material mask 65 with the mechanical protection material 66. This is a delicate step. When particles are present at the top surface of the stack 40 before the mechanical protection material 66 is applied, the particles can undesirably cause etching on the membrane layer 50 or the upper capping layer 46 when the mechanical protection material 66 is removed.

In an embodiment the mechanical protection material 66 is thick enough to provide sufficient mechanical protection to the stack 40. In an embodiment the mechanical protection material has a thickness of at least about 1 μm, and optionally at least about 2 μm. In an embodiment the mechanical protection material 66 is thin enough so as to sufficiently reduce the process time required for applying the mechanical protection material 66. In an embodiment the mechanical protection material has a thickness of at most about 10 μm, and optionally at most about 5 μm. In an embodiment the mechanical protection material 66 has a thickness of about 4 μm.

The mechanical protection material 66 is sufficiently mechanically robust so as to provide mechanical protection to the border region 72 during the step of selectively removing the inner region 71 of the planar substrate 41. The mechanical protection material 66 may be a conformal coating for protecting the coated surface, having good barrier properties such as being resistant to solvents (e.g. insoluble at room temperature), moisture, corrosion, chemical attack. It is generally desired that the mechanical protection material 66 provides a uniform layer thickness with no pinholes. In an embodiment the step of selectively removing the inner region 71 of the planar substrate 41 comprises using a chemical etchant so as to selectively remove the inner region 71 of the planar substrate 41. For example, in an embodiment the chemical etchant is KOH providing a temporary wet-etch protection. The mechanical protection material is chemically resistant to the chemical etchant. For example, in an embodiment the mechanical protection material 66 is chemically resistant to KOH. This means that when the chemical etchant is used, the mechanical protection material 66 is either not etched away at all, or is etched away at a much lower etching rate compared to the inner region 71 of the planar substrate 41.

In an embodiment, the mechanical protection material 66 is a cross linked polymer. In an embodiment the mechanical protection material 66 is an organic polymer. In an embodiment, the mechanical protection material 66 is a poly(p-xylylene) polymer, such as Parylene or ProTEK® type materials. Parylene C for example may be pinhole free already for a layer thickness as small as about 600 nm.

In an embodiment the mechanical protection material 66 is applied as a continuous layer having substantially no holes in it. The mechanical protection material 66 forms a layer that is impermeable for the etchant. During a process step of selectively removing parts of the planar substrate 41 using an etchant, the etchant cannot diffuse through the mechanical protection material 66 applied to the stack 40.

Figure 31:
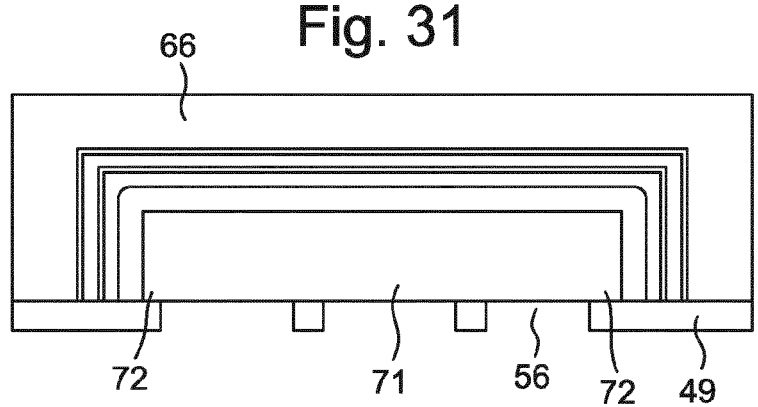

As depicted in FIG. 31, in an embodiment the step of providing the mechanical protection material 66 comprises removing the protection material mask 65. When the protection material mask 65 is removed, any mechanical protection material 66 attached to the protection material mask 65 is also removed. As a result, as shown in FIG. 31, the mechanical protection material 66 remains at the top surface and edge surfaces of the stack 40.

Figure 32:
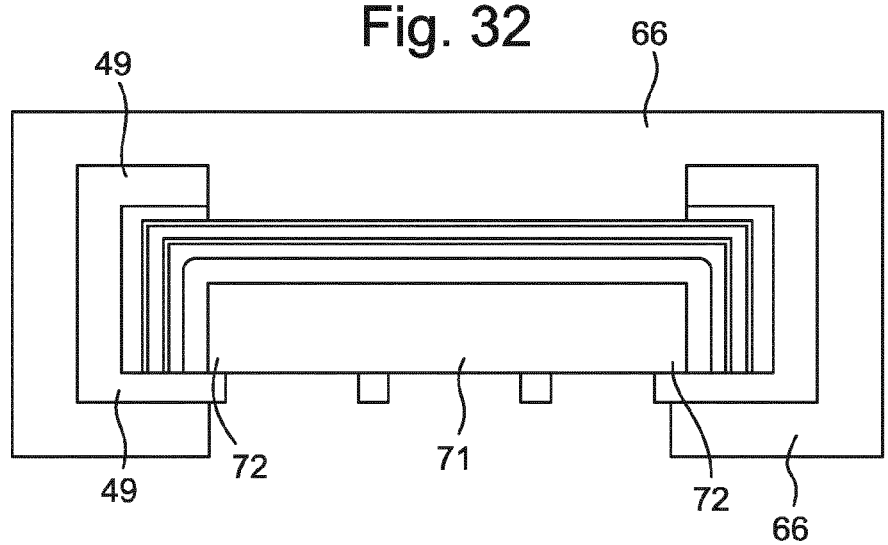

FIG. 32 depicts an alternative embodiment from the one depicted in FIG. 31. In the embodiment depicted in FIG. 32, the mask material 49 has remained at peripheral regions of the top surface of the stack 40, together with the upper sacrificial layer 47.

FIG. 33 schematically depicts the step of selectively removing the inner region 71 of the planar substrate 41. When KOH is used as the etchant, an etch time of about 12 hours may be required. The border region 72 of the planar substrate 41 remains after the etching process. Alternatively, in an embodiment the inner region 71 of the planar substrate 41 can be removed by a dry etching process or any known way to remove the inner region 71 of the planar substrate 41.

Figure 34:
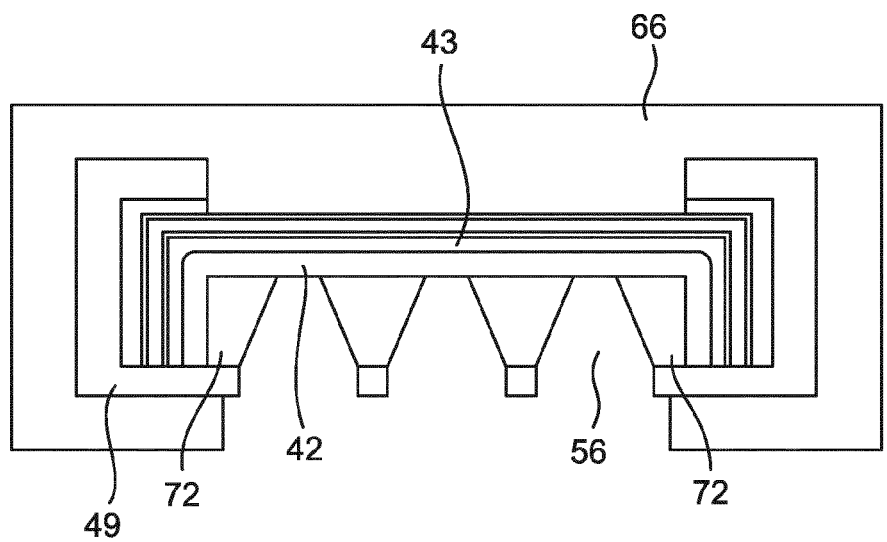

FIG. 33 schematically depicts the etching process as being ideally anisotropic. However, the etching process may not be perfectly anisotropic, as depicted in FIG. 34. FIG. 34 shows the alternative embodiment in which the mask material 49 has remained in a peripheral region at the top surface of the stack 40.

The oxidized layer 42 is resistant to the etchant used to selectively remove the inner region 71 of the planar substrate 41. When the oxidized layer 42 is provided, the etching process is stopped when the oxidized layer 42 is exposed at the bottom side of the stack 40.

As depicted in FIG. 35, any layer such as the oxidized layer 42 present at the bottom of the membrane is removed by any suitable method. As a result the bottom of the membrane is freed.

Figure 36:
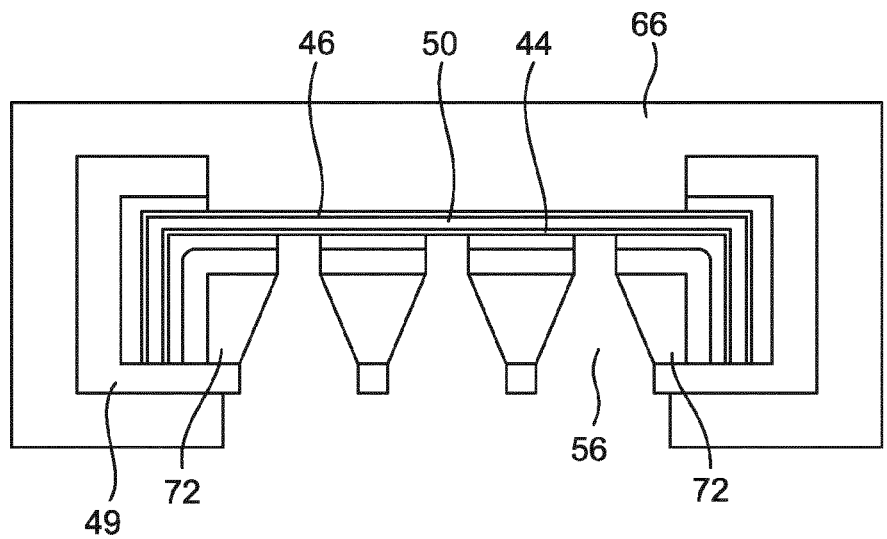

FIG. 36 depicts the alternative embodiment in which the mask material 49 has remained in the peripheral region at the top surface of the stack 40.

Figure 37:
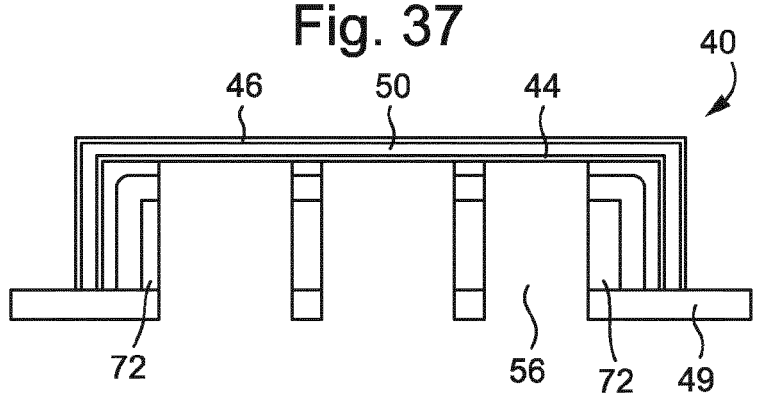

As depicted in FIG. 37, in an embodiment the method for manufacturing the membrane assembly comprises removing the mechanical protection material 66. The mechanical protection material 66 is removed after selectively removing the inner region 71 of the planar substrate 41. The mechanical protection material 66 is provided to the stack 40 before the step of selectively removing the inner region 71 of the planar substrate 41. The mechanical protection material 66 is applied before the KOH etching of the planar substrate 41.

In an embodiment the mechanical protection material 66 is removed by performing a barrel etching process. In an embodiment an Oxygen plasma is used to perform the etching process for removing the mechanical protection material 66.

As depicted in FIG. 38, the membrane assembly 80 produced by the manufacturing method comprises a membrane including the membrane layer 50 (and also the lower capping layer 44 and the upper capping layer 46) and the border 75. The border 75 is formed from the border region 72 of the planar substrate 41. In an embodiment the border 75 comprises parts of other layers of the stack 40. In particular, as depicted in FIG. 39, in an embodiment the border 75 comprises (besides the border region 72 of the planar substrate 41) also part of the mask material 49, the upper sacrificial layer 47, the upper capping layer 46, the membrane layer 50, the lower capping layer 44, the lower sacrificial layer 43, the oxidized layer 42 of the planar substrate 41 and the mask material at the bottom surface of the membrane assembly 80.

FIG. 36 depicts the alternative embodiment in which the mask material 49 has remained in the peripheral region at the top surface of the stack 40.

Figure 40:
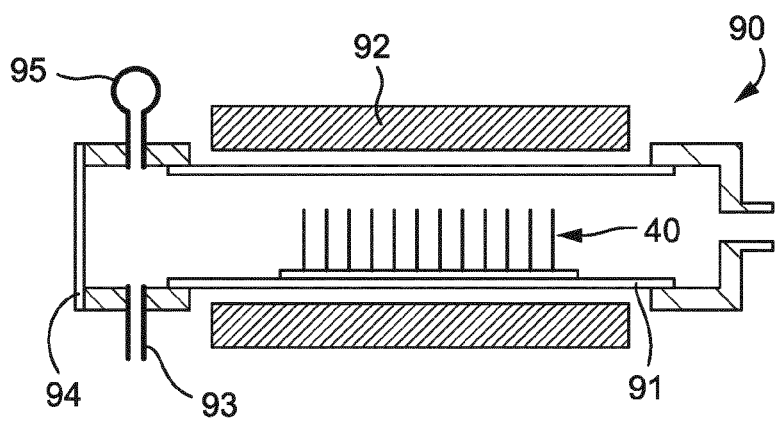
FIG. 40 schematically depicts an LPCVD chamber used in a method for manufacturing a pellicle according to an embodiment of the invention.

FIG. 40 schematically depicts a low pressure chemical vapor deposition (LPCVD) chamber 90 used in a method for manufacturing a membrane assembly according to an embodiment of the invention. LPCVD may be used to apply layers such as the lower sacrificial layer 43, the lower capping layer 44, the membrane layer 45, the upper capping layer 46, the upper sacrificial layer 47 and the mask material 49.

As depicted in FIG. 40, in an embodiment the LPCVD chamber 90 comprises a tube 91. The tube 91 is configured to house the stacks 40 onto which layers are being deposited. In an embodiment the tube 91 comprises quartz.

In an embodiment, the LPCVD chamber 90 comprises a furnace 92. The furnace 92 is configured to heat walls of the tube 91. For example, the furnace may heat the walls of the tube 91 to a target temperature. In an embodiment the furnace 92 is formed around the tube 91.

In an embodiment the LPCVD chamber 90 comprises a gas inlet 93. The gas inlet is configured to allow gas to flow into the tube 91. In an embodiment the LPCVD chamber 90 comprises a pressure sensor 95. The pressure sensor 95 is configured to sense a pressure inside the tube 91. Based on measurements from the pressure sensor 95, gas flow through the gas inlet 93 into the tube can be controlled so as to provide a target pressure within the tube 91.

In an embodiment, the LPCVD chamber 90 comprises a load door 94. The load door 94 is configured to open and close so as to control access to the inside of the tube 91. When the load door 94 is open, stacks 40 can be inserted into the tube 91. When the load door 94 is closed, stacks 40 cannot be inserted into the tube 91. The load door 94 is closed so that the temperature and pressure inside the tube 91 can be controlled more accurately and easily.

An embodiment of the invention is expected to achieve a reduction of out-of-band radiation that reaches the substrate W. Such out-of-band radiation can be emitted by EUV sources based on a Sn plasma. The out-of-band radiation comprises radiation in the DUV range (100-400 nm). In the case of LPP EUV sources, the out-of-band radiation comprises radiation from the laser, typically in the IR radiation range such as at a wavelength of 10.6 µm, that could otherwise present a significant amount of unwanted radiation.

Resist can be sensitive to out-of-band wavelengths. Accordingly, by reducing the out-of-band radiation, the image quality may be improved. Unwanted radiation, especially the 10.6 µm radiation in LPP sources, can lead to unwanted heating of the patterning device MA, the substrate W and optics. By reducing the out-of-band radiation, heating of the patterning device MA, the substrate W and optics is reduced.

DUV radiation can cause resist blurring. By reducing the DUV radiation that reaches the substrate W, resist blurring can be reduced. Particles on the patterning device MA can cause deterioration of the image quality. An embodiment of the invention is expected to achieve a reduction of particles on the patterning device MA. By reducing the particles on the patterning device MA, the image quality can be improved.

In an embodiment, the membrane assembly 80 can be used as a pellicle placed in front of the patterning device MA and thus protect the patterning device MA. An embodiment of the invention is expected to achieve a reduction of fragility of a pellicle. An embodiment of the invention is expected to make it easier to produce membrane assemblies in high volume. An embodiment of the invention is expected to enable the processing of a free standing membrane integrated in a frame.

In an embodiment the membrane assembly 80 is configured to transmit at least 90% of radiation having a wavelength of 13.5 nm or another wavelength in the EUV radiation range used for the lithographic exposure. In an embodiment the membrane assembly 80 is configured to transmit less than 5% of DUV radiation (approximately 100-400 nm).

In an embodiment the membrane layer 50 of the membrane assembly 80 comprises silicon. Silicon is one of the most transparent elements to EUV radiation. Silicon is a commonly processed and available material. In an embodiment the membrane layer 50 is capped with one or more layers of material selected from Ru, Zr, Mo, a silicon oxide, a zirconium oxide, an aluminum oxide, boron nitride, a ruthenium oxide, a ruthenium nitride, a zirconium nitride, a molybdenum oxide or a molybdenum nitride. The membrane assembly 80 may be used in an environment that contains hydrogen radicals. Such a combination is expected to reduce hydrogen-induced outgassing and the consequent redeposition of silicon.

In an embodiment the membrane assembly 80 is applied as a pellicle or as part of a dynamic gas lock. Alternatively, the membrane assembly 80 can be applied in other filtration areas such as the intervening space, or for beam splitters.

In an embodiment, there is provided a method for manufacturing a membrane assembly for EUV lithography, the method comprising: providing a stack comprising a planar substrate and at least one membrane layer, wherein the planar substrate comprises an inner region and a border region around the inner region; and selectively removing the inner region of the planar substrate, such that the membrane assembly comprises: a membrane formed from the at least one membrane layer; and a border holding the membrane, the border formed from the border region of the planar substrate; wherein the stack is provided with a mechanical protection material configured to mechanically protect the border region during the step of selectively removing the inner region of the planar substrate.

In an embodiment, the step of selectively removing the inner region of the planar substrate comprises using a chemical etchant so as to selectively remove the inner region of the planar substrate, wherein the mechanical protection material is chemically resistant to the chemical etchant. In an embodiment, the method comprises removing the mechanical protection material after selectively removing the inner region of the planar substrate. In an embodiment, the mechanical protection material has a thickness of at least 1 µm. In an embodiment, the mechanical protection material has a thickness of at most 5 µm. In an embodiment, the mechanical protection material a cross linked polymer. In an embodiment, the mechanical protection material is a poly (p-xylylene) polymer. In an embodiment, the mechanical protection material is a Parylene or ProTEK® type material. In an embodiment, the step of selectively removing the inner region of the planar substrate comprises: depositing a mask material to the bottom surface of the stack; selectively removing the mask material such that a mask layer is formed from the mask material deposited to the bottom surface of the stack corresponding to the border region of the planar substrate; and anisotropically etching the inner region of the planar substrate. In an embodiment, the planar substrate comprises an oxidized layer having a thickness greater than 100 nm and a non-oxidized layer, wherein the oxidized layer is between the non-oxidized layer and the at least one membrane layer. In an embodiment, the at least one membrane layer is applied to the planar substrate by chemical vapor deposition. In an embodiment, the at least one membrane layer comprises at least one polycrystalline silicon layer. In an embodiment, the at least one polycrystalline silicon layer is formed by crystallizing at least one amorphous silicon layer. In an embodiment, the membrane assembly is for a patterning device or a dynamic gas lock.

In an embodiment, there is provided a membrane assembly for EUV lithography, the membrane assembly comprising: a membrane formed from at least one membrane layer comprising polycrystalline silicon or monocrystalline silicon; and a border holding the membrane; wherein the membrane is capped by an upper capping layer and a lower capping layer, each of the upper capping layer and the lower capping layer comprising at least one of Ru, Zr, Mo, a silicon oxide, a zirconium oxide, an aluminum oxide, boron nitride, a ruthenium oxide, a ruthenium nitride, a zirconium nitride, a molybdenum oxide or a molybdenum nitride or a molybdenum silicide, wherein the border is formed from a planar substrate comprising an inner region and a border region around the inner region, wherein the border is formed by selectively removing the inner region of the planar substrate, wherein the planar substrate comprises an oxidized layer and a non-oxidized layer, such that the border comprises the oxidized layer and the non-oxidized layer, wherein the oxidized layer is between the non-oxidized layer and the at least one membrane layer, wherein the border comprises a mask layer, wherein the border region of the planar substrate is between the mask layer and the at least one membrane layer.

In an embodiment, the mask layer comprises a silicon nitride. In an embodiment, the oxidized layer comprises silicon dioxide. In an embodiment, the membrane layer has a thickness in the range of from 35 nm to 150 nm. In an embodiment, each of the upper capping layer and the lower capping layer has a thickness less than or equal to 2.5 nm. In an embodiment, a combined thickness of the membrane layer, the upper capping layer and the lower capping layer is less than or equal to 50 nm. In an embodiment, the oxidized layer has a thickness in the range of from 200 nm to 500 nm. In an embodiment, the non-oxidized layer has a thickness in the range of from 500 µm to 1 mm. In an embodiment, the mask layer has a thickness in the range of from 100 nm to 200 nm. In an embodiment, the membrane assembly comprises a lower sacrificial layer between the oxidized layer and the membrane layer. In an embodiment, the lower sacrificial layer comprises amorphous silicon. In an embodiment, the lower sacrificial layer has a thickness in the range of from 10 nm to 50 nm. In an embodiment, the membrane assembly is for a patterning device or a dynamic gas lock.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

While specific embodiments of the invention have been described above, it will be appreciated that the invention may be practiced otherwise than as described. For example, the various lacquer layers may be replaced by non-lacquer layers that perform the same function.

The descriptions above are intended to be illustrative, not limiting. Thus it will be apparent to one skilled in the art that modifications may be made to the invention as described without departing from the scope of the claims set out below.

The invention claimed is:

1. A method for manufacturing a membrane assembly for EUV lithography, the method comprising:
   providing a stack comprising a planar substrate and a membrane layer, wherein the planar substrate comprises an inner region and a border region around the inner region and the stack has a top, a bottom and a side between the top and the bottom; and
   selectively removing the inner region of the planar substrate, such that the membrane assembly comprises:
      a membrane formed from the membrane layer; and
      a border holding the membrane, the border formed from the border region of the planar substrate,
   wherein the stack is provided with a mechanical protection material configured to mechanically protect the border region during the selectively removing the inner region of the planar substrate and extending at least partly along the side of the stack.

2. The method of claim 1, wherein the selectively removing the inner region of the planar substrate comprises using a chemical etchant so as to selectively remove the inner region of the planar substrate, wherein the mechanical protection material is chemically resistant to the chemical etchant.

3. The method of claim 1, further comprising removing the mechanical protection material after selectively removing the inner region of the planar substrate.

4. The method of claim 1, wherein the mechanical protection material has a thickness of at least 1 µm.

5. The method of claim 1, wherein the mechanical protection material has a thickness of at most 5 µm.

6. The method of claim 1, wherein the mechanical protection material comprises a cross linked polymer.

7. The method of claim 1, wherein the mechanical protection material comprises a poly(p-xylylene) polymer.

8. The method of claim 1, wherein the selectively removing the inner region of the planar substrate comprises:
   depositing a mask material to the bottom surface of the stack;
   selectively removing part of the mask material such that a mask layer is formed from the mask material deposited to the bottom surface of the stack corresponding to the border region of the planar substrate; and
   anisotropically etching the inner region of the planar substrate.

9. The method of claim 1, wherein the planar substrate comprises an oxidized layer having a thickness greater than 100 nm and a non-oxidized layer, wherein the oxidized layer is between the non-oxidized layer and the membrane layer.

10. The method of claim 1, wherein the membrane layer comprises a polycrystalline silicon layer.

11. The method of claim 10, wherein the at least one polycrystalline silicon layer is formed by crystallizing at least one amorphous silicon layer.

12. The method of claim 1, wherein the membrane assembly is for a patterning device or a dynamic gas lock.

13. The method of claim 1, wherein the membrane is capped by a capping layer comprising at least one selected from: Ru, Zr, Mo, a silicon oxide, a zirconium oxide, an aluminum oxide, boron nitride, a ruthenium oxide, a ruthenium nitride, a zirconium nitride, a molybdenum oxide, a molybdenum nitride or a molybdenum silicide.

14. The method of claim 1, further comprising:
   using a protection material mask during application of the mechanical protection material to the stack to prevent the mechanical protection material from coming into contact with a surface of the stack; and
   removing the protection material mask to expose a portion of the stack for the selective removal of the inner region of the planar substrate.

15. A method for manufacturing a membrane assembly for EUV lithography, the method comprising:
   providing a stack comprising a planar substrate and a membrane layer; and
   selectively removing at least part of the planar substrate, such that the membrane assembly comprises:
      a membrane formed from the membrane layer; and
      a border holding the membrane,
   wherein the stack is provided with a mechanical protection material comprising a polymer, the mechanical protection material configured to mechanically protect the border during the selectively removing the at least part of the planar substrate.

16. The method of claim 15, wherein the mechanical protection material has a thickness of at least 1 µm and at most 5 µm.

17. The method of claim 15, wherein the polymer comprises a cross linked polymer.

18. The method of claim 15, wherein the polymer comprises a poly(p-xylylene) polymer.

19. The method of claim 15, further comprising removing the mechanical protection material after selectively removing the at least part of the planar substrate.

20. The method of claim 15, further comprising:
   using a protection material mask during application of the mechanical protection material to the stack to prevent the mechanical protection material from coming into contact with a surface of the stack; and
   removing the protection material mask to expose a portion of the stack for the selective removal of the at least part of the planar substrate.

21. A method for manufacturing a membrane assembly for EUV lithography, the method comprising:
providing a stack comprising a planar substrate and a membrane layer, wherein the planar substrate comprises an inner region and a border region around the inner region; and
selectively removing the inner region of the planar substrate, such that the membrane assembly comprises:
a membrane formed from the membrane layer; and
a border holding the membrane, the border formed from the border region of the planar substrate,
wherein the stack is provided with a mechanical protection material configured to mechanically protect the border region during the selectively removing the inner region of the planar substrate and wherein at least part of the mechanical protection material extends at an orientation non-parallel to at least part of the membrane layer or another layer of the stack.

* * * * *